United States Patent
Lee

(10) Patent No.: US 10,304,549 B2
(45) Date of Patent: *May 28, 2019

(54) NONVOLATILE MEMORY DEVICE THAT APPLIES DIFFERENT RECOVERY VOLTAGES TO WORD LINES IN TRANSITION FROM VERIFICATION OPERATION TO BIT LINE SETUP OPERATION AND PROGRAM METHOD OF THE SAME

(71) Applicant: SAMSUNG ELECTRONICS CO., LTD., Suwon-si, Gyeonggi-do (KR)

(72) Inventor: Ji-Sang Lee, Iksan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/639,459

(22) Filed: Jun. 30, 2017

(65) Prior Publication Data

US 2018/0190363 A1 Jul. 5, 2018

(30) Foreign Application Priority Data

Dec. 29, 2016 (KR) .................. 10-2016-0182881

(51) Int. Cl.
| | | |
|---|---|---|
| G11C 16/04 | (2006.01) | |
| G11C 16/34 | (2006.01) | |
| G11C 16/10 | (2006.01) | |
| G11C 16/08 | (2006.01) | |
| G11C 16/24 | (2006.01) | |

(52) U.S. Cl.
CPC ...... *G11C 16/3431* (2013.01); *G11C 16/0483* (2013.01); *G11C 16/08* (2013.01); *G11C 16/10* (2013.01); *G11C 16/24* (2013.01); *G11C 16/3418* (2013.01); *G11C 16/3459* (2013.01)

(58) Field of Classification Search
CPC .. G11C 16/3431; G11C 16/3459; G11C 16/10
USPC ..................................... 365/185.02
See application file for complete search history.

(56) References Cited

U.S. PATENT DOCUMENTS

| | | |
|---|---|---|
| 6,859,397 B2 | 2/2005 | Lutze et al. |
| 7,545,675 B2 | 6/2009 | Kamei |
| 8,085,601 B2 | 12/2011 | Kim |
| 8,514,621 B2 | 8/2013 | Choi et al. |
| 9,349,471 B2 | 5/2016 | Yun |
| 9,805,807 B2 * | 10/2017 | Lee ........................ G11C 16/16 |
| 2009/0016111 A1 * | 1/2009 | Kim .................. G11C 16/3418 365/185.17 |

(Continued)

FOREIGN PATENT DOCUMENTS

JP 10149688 6/1998

*Primary Examiner* — Tha-O H Bui
(74) *Attorney, Agent, or Firm* — Volentine, Whitt & Francos, PLLC

(57) ABSTRACT

A nonvolatile memory device may include a memory cell array and a control logic. The memory cell array has a plurality of memory cells connected to a plurality of word lines. The control logic controls, in a transition process from a verification step to a bit line setup step for a program operation of the plurality of memory cells, an application of a recovery voltage to a word line among the plurality of word lines. The recovery voltage applied to the word line is different from a recovery voltage applied to other word lines.

17 Claims, 21 Drawing Sheets

(56) References Cited

U.S. PATENT DOCUMENTS

2013/0265829 A1* 10/2013 Suzuki .................. G11C 16/10
  365/185.22
2016/0005479 A1   1/2016 Lee et al.
2016/0260489 A1   9/2016 Lee et al.

* cited by examiner

NONVOLATILE MEMORY DEVICE THAT APPLIES DIFFERENT RECOVERY VOLTAGES TO WORD LINES IN TRANSITION FROM VERIFICATION OPERATION TO BIT LINE SETUP OPERATION AND PROGRAM METHOD OF THE SAME

CROSS-REFERENCE TO RELATED APPLICATION

This application claims the benefit of Korean Patent Application No. 10-2016-0182881, filed on Dec. 29, 2016, in the Korean Intellectual Property Office, the disclosure of which is incorporated herein in its entirety by reference.

BACKGROUND

The disclosure relates to a memory device, and more particularly, to a nonvolatile memory device and a program method of the same.

Semiconductor memory devices are memory devices realized by using semiconductors such as silicon (Si), germanium (Ge), gallium arsenide (GaAs), and indium phosphide (InP). Semiconductor memory devices are generally classified into volatile semiconductor memory devices and nonvolatile semiconductor memory devices.

Nonvolatile memory devices are memory devices in which data stored therein does not vanish even with a cut-off of power supply. Nonvolatile memory devices may include read-only memories (ROMs), programmable ROMs (PROMs), erasable PROMs (EPROMs), electrically EPROMs (EEPROMs), flash memory devices, phase-change random-access memories (RAMs) (PRAMs), magneto-resistive RAMs (MRAMs), and ferroelectric RAMs (FRAMs). Flash memory devices may be largely classified into a NOR type and a NAND type.

SUMMARY

The disclosure provides a nonvolatile memory device and a program method of the same for improving program disturb.

According to an aspect of the disclosure, there is provided a nonvolatile memory device having a memory cell array including a plurality of memory cells connected to a plurality of word lines. A control logic controls, in a transition process from a verification step to a bit line setup step for a program operation of the plurality of memory cells, application of a recovery voltage to at least one word line among the plurality of word lines, the recover voltage being different from a recovery voltage applied to other word lines.

According to another aspect of the disclosure, there is provided a program method of a nonvolatile memory device for programming memory cells connected to a plurality of word lines. The method includes applying a plurality of verification voltages to the plurality of word lines and executing a recovery step by: (1) applying a first recovery voltage to at least one word line among the plurality of word lines and (2) applying a secondary recovery voltage having a lower voltage level than the first recovery voltage to other word lines, except the at least one word line. A program voltage is applied to a selected word line, among the plurality of word lines. The selected word line is a program target. A pass voltage is applied to an unselected word line which is not the program target.

According to another aspect of the disclosure, there is provided a memory device having a string of memory cells and a control logic. Each of the memory cells is addressed by a bit line and a different word line among a plurality of word lines. The control logic, while transitioning from a program-verification operation of an Nth-programming operation to a bit-line setup operation for an (N+1)th programming operation of a target memory cell of the memory cells, applies a first recovery voltage to a selected word line among the plurality of word lines and a second recovery voltage, which is different from the first recovery voltage, to another word line among the plurality of word lines that is not the selected word line.

BRIEF DESCRIPTION OF THE DRAWINGS

Embodiments of the disclosure will be more clearly understood from the following detailed description taken in conjunction with the accompanying drawings in which.

DETAILED DESCRIPTION OF THE EMBODIMENTS

Figure 1:
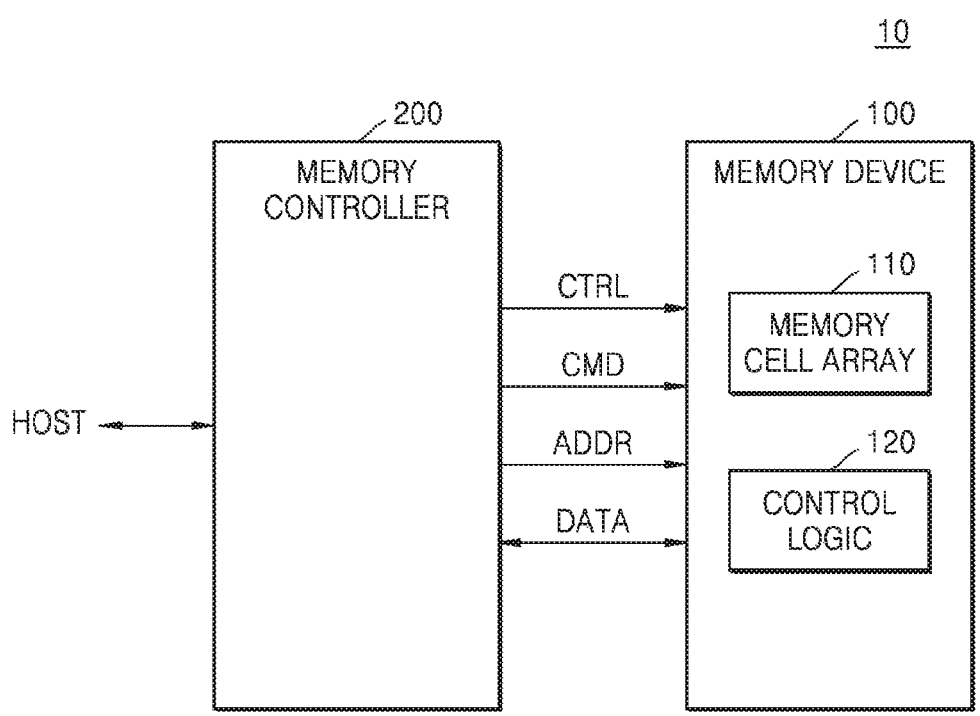
FIG. 1 is a block diagram of a nonvolatile memory system according to an embodiment of the present disclosure.

FIG. 1 is a block diagram of a nonvolatile memory system 10 according to an embodiment of the present disclosure.

Referring to FIG. 1, the nonvolatile memory system 10 may include a nonvolatile memory device 100 and a memory controller 200, and the nonvolatile memory device 100 may include a memory cell array 110 and a control logic 120.

The memory cell array 110 may include a plurality of memory cells. For example, the plurality of memory cells may be flash memory cells. Below, embodiments will be described for the case in which the plurality of memory cells are NAND flash memory cells. However, the embodiment is not limited thereto. The plurality of memory cells may be various kinds of nonvolatile memory cells. In the embodiment, the plurality of memory cells may be resistive memory cells such as RRAMs (resistive RAMs), PRAMs, and MRAMs.

According to an embodiment of the present disclosure, the memory cell array 110 may include a plurality of cell strings sharing a bit line. Each of the plurality of cell strings may include a ground selection transistor connected to a ground selection line, word lines, and a string selection line, memory cells, and a string selection transistor. The memory cell array 110 may be a two-dimensional (2D) memory array. Alternatively, the memory cell array 110 may be a three-dimensional (3D) memory array.

The 3D memory array may be monolithically formed on at least one physical level of memory cell arrays which include an active region on a silicon substrate and a circuit related with operation of the memory cells on or in the silicon substrate. The term "monolithic" may mean that layers of each level constituting the memory cell array are directly stacked above the layers of each lower level of the memory cell array.

According to an embodiment of the present disclosure, the 3D memory array may include cell strings arranged in a vertical direction so that at least one memory cell is placed on another memory cell. The at least one memory cell may include a charge trapping layer. The following patent documents, which are hereby incorporated by reference, describe suitable configurations for three-dimensional memory arrays, in which a three-dimensional memory array is configured as a plurality of levels, with word lines and/or bit lines shared between the levels: U.S. Pat. Nos. 7,679,133; 8,553,466; 8,654,587; and 8,559,235; and US Pat. Pub. No. 2011/0233648. In addition, U.S. Pat. Nos. 2014/0334232; and 8,488,381 are hereby incorporated by reference.

The control logic 120 may control a program operation of memory cells included in the memory cell array 110. The program operation may include a verification step and a program step. For each program operation step, the control logic 120 may control application of different voltages from each other to a plurality of word lines included in the memory cell array 110. In the verification step, a verification voltage may be applied to each of the plurality of word lines, and in the program step, the program voltage or a pass voltage may be applied to each word line. In addition, when the verification step is complete and the program step starts, a recovery may be executed for the plurality of word lines. In this case, the control logic 120 may control application of a recovery voltage to the plurality of word lines. In the present disclosure, the recovery or a recovery operation may denote that a voltage level of the word line gradually decreases from a first voltage level to a second voltage level by applying the second voltage level to the word line. According to an embodiment of the present disclosure, when the recovery for the plurality of word lines is executed, the control logic 120 may control application of the recovery voltage higher than about 0 V to at least one of the plurality of word lines. Hereinafter in the present specification, the recovery executed by applying the recovery voltage higher than about 0 V may be defined as a positive recovery.

The memory controller 200 may control the nonvolatile memory device 100 in response to read/write requests from a host HOST so that data stored in the nonvolatile memory device 100 is read or data is written in the nonvolatile memory device 100. The memory controller 200 may control a program (or writing) operation, a read (or reading) operation, and a deleting operation by providing an address ADDR, a command CMD, and a control signal CTRL. In addition, data DATA for the program operation and read data DATA may be transmitted between the memory controller 200 and the nonvolatile memory device 100.

Even though not shown, the memory controller 200 may include a RAM, a processing unit, a host interface, and a memory interface. The RAM may be used as an operation memory of the processing unit and the processing unit may control operation of the memory controller 200. The host interface may include a protocol for executing data exchange between the host HOST and the memory controller 200. For example, the memory controller 200 may be configured to communicate with the outside (or the host HOST) via at least one of various interface protocols such as universal serial buses (USBs), multi-media cards (MMCs), peripheral component interconnect expresses (PCI-Es), advanced technology attachments (ATAs), serial-ATAs, parallel-ATAs, small computer system interfaces (SCSIs), enhanced small disk interfaces (ESDIs), and integrated drive electronics (IDEs).

Figure 2:
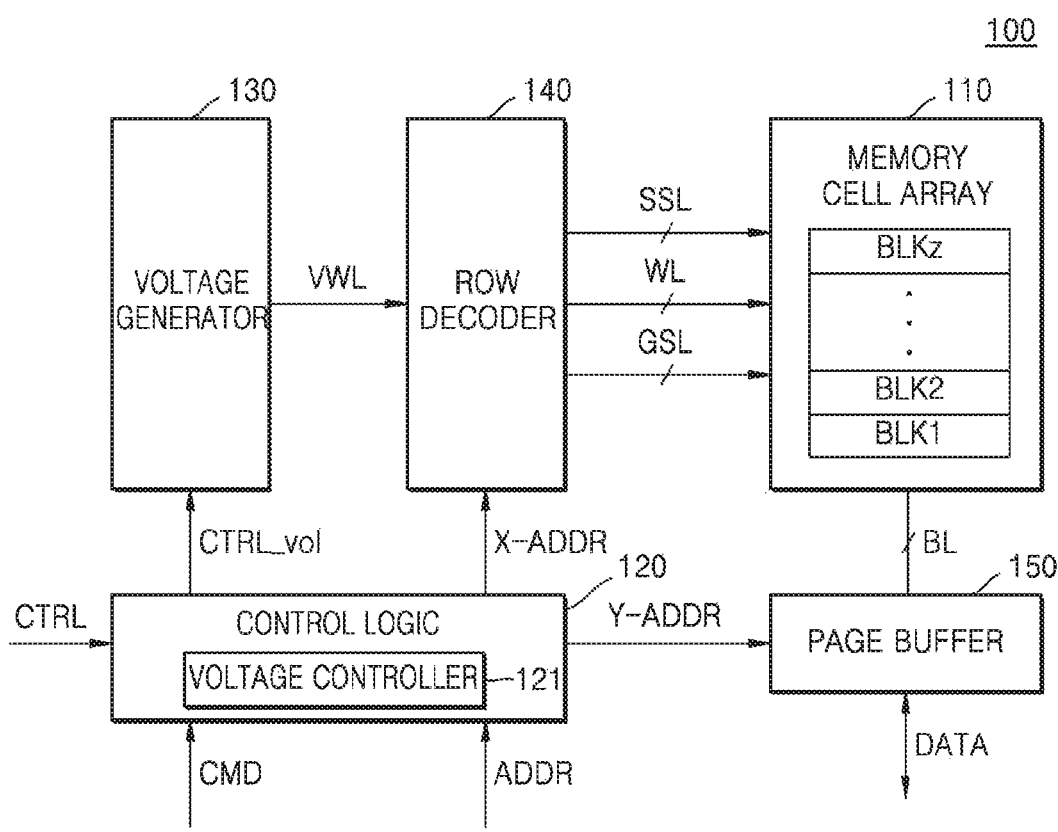
FIG. 2 is a detailed block diagram of a nonvolatile memory device according to an embodiment of the present disclosure.

FIG. 2 is a detailed block diagram of a nonvolatile memory device 100 according to an embodiment of the present disclosure.

Referring to FIG. 2, the nonvolatile memory device 100 may include the memory cell array 110, the control logic 120, a voltage generator 130, a row decoder 140, and a page buffer 150. Even though not shown, the nonvolatile memory device 100 may further include a data input/output circuit or an input/output interface.

The memory cell array 110 may include the plurality of memory cells, and be connected to word lines WL, string selection lines SSL, ground selection lines GSL, and bit lines BL. The memory cell array 110 may be connected to the row decoder 140 via the word lines WL, the string selection lines SSL, and the ground selection lines GSL, and be connected to the page buffer 150 via bit lines BL.

The memory cell array 110 may include a plurality of memory blocks BLK1 through BLKz. Each memory block may include a 2D structure or a 3D (or vertical) structure. The memory blocks BLK1 through BLKz may be selected by the row decoder 140. For example, the row decoder 140 may select a memory block corresponding to a block address among the memory blocks BLK1 through BLKz. At least one memory block of the memory blocks BLK1 through BLKz may include a plurality of cell strings sharing bit lines BL.

The memory cell array 110 may include at least one of a single-level cell block including single-level cells, a multi-level cell block including multi-level cells, and a triple-level cell block including triple-level cells. In other words, a portion of the memory blocks BLK1 through BLKz included in the memory cell array 110 may be single-level cell blocks, while another portion may be multi-level cell blocks or triple-level cell blocks.

The control logic 120 may generate various control signals for programming data in the memory cell array 110 or reading data from the memory cell array 110, based on the command CMD, the address ADDR, and the control signal CTRL received from the memory controller 200. In this manner, the control logic 120 may generally control various operations in the nonvolatile memory device 100.

Various control signals generated by the control logic 120 may be provided to the voltage generator 130, the row decoder 140, and the page buffer 150. The control logic 120 may provide a voltage control signal CTRL_vol to the voltage generator 130, a row address X-ADDR to the row decoder 140, and a column address Y-ADDR to the page buffer 150. However, the embodiment is not limited thereto. The control logic 120 may further provide other control signals to the voltage generator 130, the row decoder 140, and the page buffer 150.

The control logic 120 may include a voltage controller 121. The voltage controller 121 may generate the voltage control signal CTRL_vol for generating a word line voltage for driving the word lines WL, a string selection line voltage for driving the string selection lines SSL, and a ground selection line voltage for driving the ground selection lines GSL. The voltage generator 130 may generate various voltages VWL, such as the string selection line voltage, the ground selection line voltage, and the word line voltage, under the control of the voltage controller 121 and in accordance with the voltage control signal CTRL_vol.

According to an embodiment of the present disclosure, when a program operation moves from the verification step to the program step, the voltage controller 121 may control the voltage generator 130 so that the recovery voltage higher than about 0 V is applied to at least one of the word lines and a ground voltage GND is applied to other word lines. According to another embodiment, the voltage controller 121 may control the voltage generator 130 so that a first recovery voltage higher than about 0 V is applied to the first word line, a second recovery voltage higher than the first recovery voltage is applied to the second word line, and the ground voltage GND is applied to other word lines.

The voltage generator 130 may generate various kinds of voltages VWL for executing program, read, and delete operations of the memory cell array 110 based on the voltage control signal CTRL_vol. The voltage generator 130 may generate word line voltages, for example, a program voltage (or write voltage), a recovery voltage, a read voltage, a program inhibition voltage, a read inhibition voltage, a delete verification voltage, and a program verification voltage. In addition, the voltage generator 130 may generate the recovery voltage having a higher voltage level than about 0 V in a recovery step, based on the voltage control signal CTRL_vol.

The row decoder 140 may select a portion of the word lines WL in response to the row address X-ADDR received from the control logic 120. In the read operation, the row decoder 140 may apply the read voltage to selected word lines WL and a read pass voltage to unselected word lines WL. In addition, in the program operation, the row decoder 140 may apply the program voltage to the selected word lines WL and apply a program pass voltage to the unselected word lines WL. Hereinafter in the present specification, the word lines WL connected to program target memory cells may be denoted as the selected word lines WL and other word lines may be denoted as the unselected word lines WL. According to an embodiment of the present disclosure, the row decoder 140 may apply the recovery voltage to at least a portion of the word lines WL in response to the row address X-ADDR received from the control logic 120 and may apply the ground voltage GND to the other word lines WL at the recovery step.

The page buffer 150 may be connected to the memory cell array 110 via the bit lines BL and may select a portion of the bit lines BL in response to the column address Y-ADDR received from the control logic 120. In the read operation, the page buffer 150 may operate as a sense amplifier and detect data DATA stored in the memory cell array 110. On the other hand, the page buffer 150 may operate as a write driver and, in the program operation, input data DATA to be stored in the memory cell array 110.

According to the nonvolatile memory device 100 and the program method thereof, in the recovery operation, voltage potential differences between the word lines WL may be reduced by executing the positive recovery to at least one of the word lines WL, and accordingly, a hot carrier injection (HCI) phenomenon that may occur in the nonvolatile memory device 100 may be reduced, according to an embodiment of the present disclosure. As a result, program disturb of the nonvolatile memory device 100 may be improved. Detailed descriptions on this issue will be provided later with reference to FIG. 7, etc.

Figure 3:
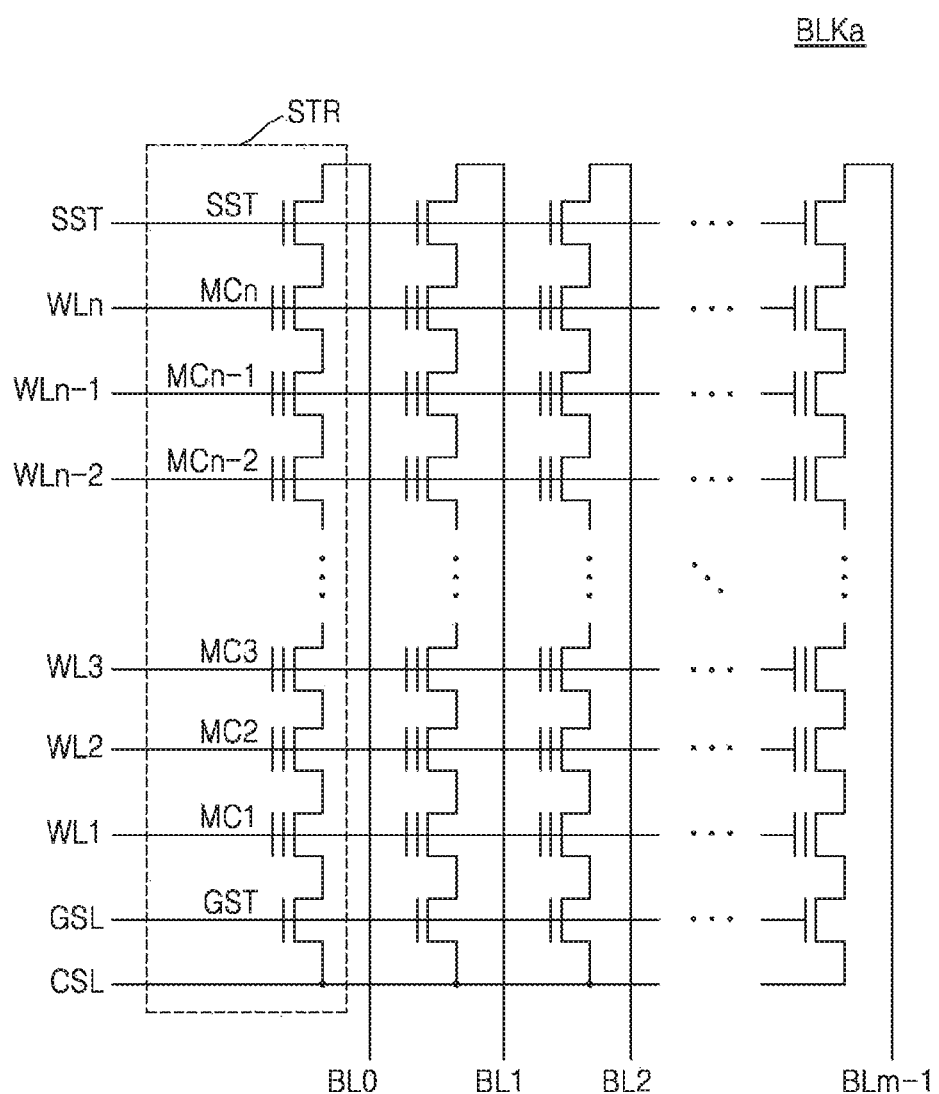
FIG. 3 is a circuit diagram of a memory block included in a memory cell array, according to an embodiment of the present disclosure.

FIG. 3 is a circuit diagram of a memory block BLKa included in a memory cell array, according to an embodiment of the present disclosure.

Referring to FIG. 3, a memory cell array (for example, 110 of FIG. 2) may include a horizontal NAND flash memory and a plurality of memory blocks BLKa. Each of the memory blocks BLKa may include m (m is an integer equal to or greater than 2) cell strings STR in which a multiple of memory cells MC are serially connected to each other in a direction of bit lines BL0 through BLm−1. For example, each of the cell strings STR is illustrated as including eight memory cells MC1 through MCn in FIG. 3. Additionally, each of the cell strings STR includes a ground selection transistor GST and a string selection transistor SST. The ground selection transistors GST are selected by a ground selection line GSL, and the string selection transistors are selected by a string selection line SSL. For each string STR, the string selection transistor SST, memory cells MC1 through MCn, and ground selection transistor GST are serially connected between a bit line (e.g., one of bit lines BL0 through BLm−1) and a common source line CSL.

The NAND flash memory device having a structure of FIG. 3 may execute the delete operation per block and the program operation per page, corresponding to each of the word lines WL1 through WLn. FIG. 3 illustrates an example in which one block includes n pages for n word lines WL1 through WLn. In addition, the nonvolatile memory device 100 in FIGS. 1 and 2 may include a plurality of memory cell arrays which execute identical operations with identical structure, like the memory cell array 110 described above.

Figure 4:
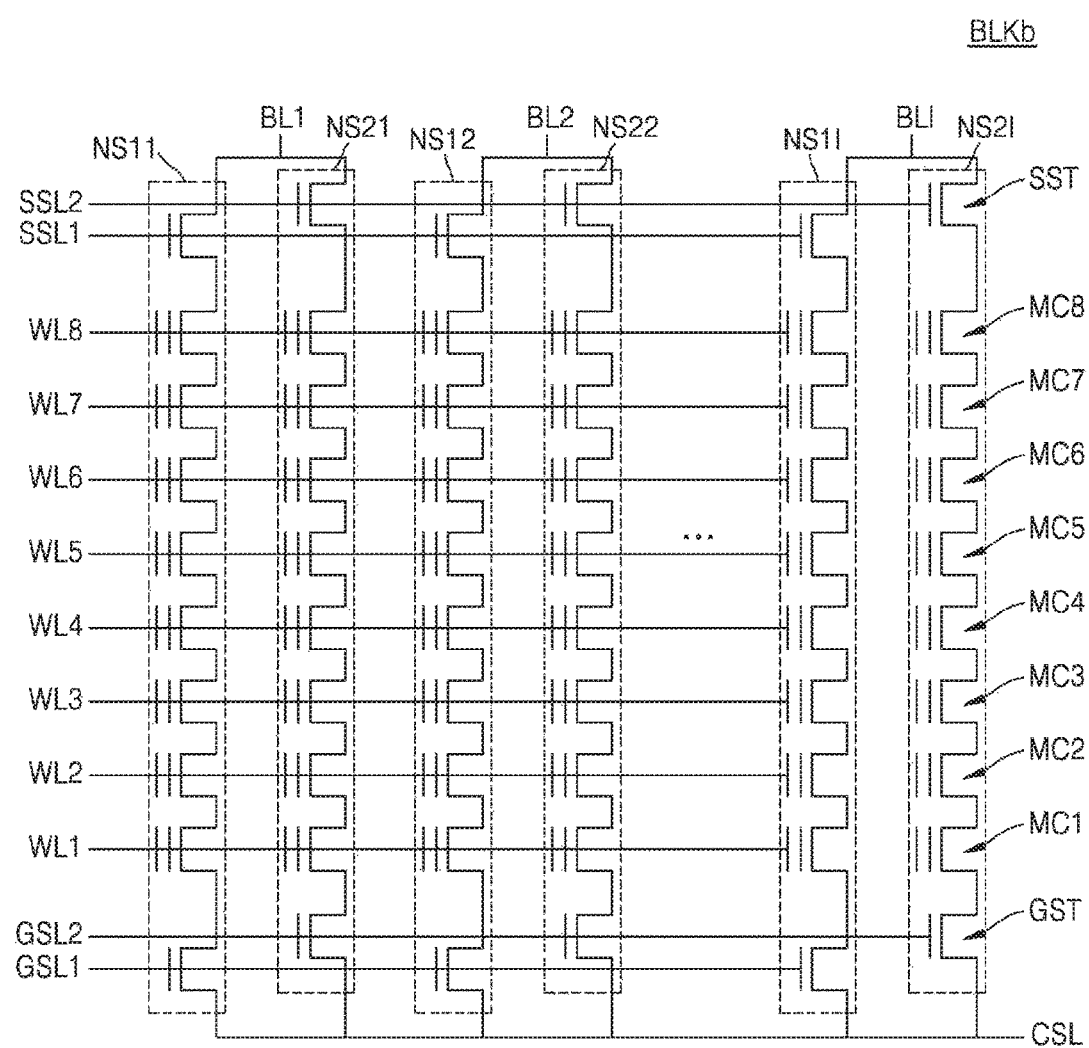
FIG. 4 is a circuit diagram of another example of the memory block included in a memory cell array, according to an embodiment of the present disclosure.

FIG. 4 is a circuit diagram of a memory block BLKb included in a memory cell array, according to an embodiment of the present disclosure.

Referring to FIG. 4, the memory block BLKb may be the NAND flash memory including a horizontal structure. The memory block BLKb may include a plurality of cell strings NS11 through NS2I, a plurality of word lines WL1 through WL8, a plurality of bit lines BL1 through BL1, a plurality of ground selection lines GSL1 and GSL2, a plurality of string selection lines SSL1 and SSL2, and a common source line CSL. In this case, the numbers of the cell strings, the word lines, the bit lines, the ground selection lines, and the string selection lines may be variously changed according to embodiments. Particularly, the number of string selection lines may increase with the number of memory cells corresponding to the word lines, and accordingly, the program disturb may increase. Configurations and connection relations of each of the plurality of cell strings NS11 through NS2I may be similar to those of cell strings STR illustrated in FIG. 3. Thus, detailed descriptions thereof will be omitted.

The plurality of cell strings NS11 through NS2I may share the word lines WL1 through WL8 and at least two cell strings may share one bit line BL. The cell strings sharing one bit line BL may be connected to different string selection lines from each other and different ground selection lines from each other. For example, the cell strings NS11 and NS21 may share the first bit line BL1, a string selection transistor SST and a ground selection transistor GST of the cell string NS11 may be respectively connected to a first string selection line SSL1 and a first ground selection line GSL1, and the string selection transistor SST and the ground selection transistor GST of the cell string NS21 may be respectively connected to a second string selection line SSL2 and a second ground selection line GSL2. Accordingly, when data DATA is read from the first through eighth memory cells MC1 through MC8 which are connected to the first word line WL1 and included in cell strings NS11 through NS11, the first word line WL1, the first string selection line SSL1, and the first ground selection line GSL1 may be selected.

Figure 5:
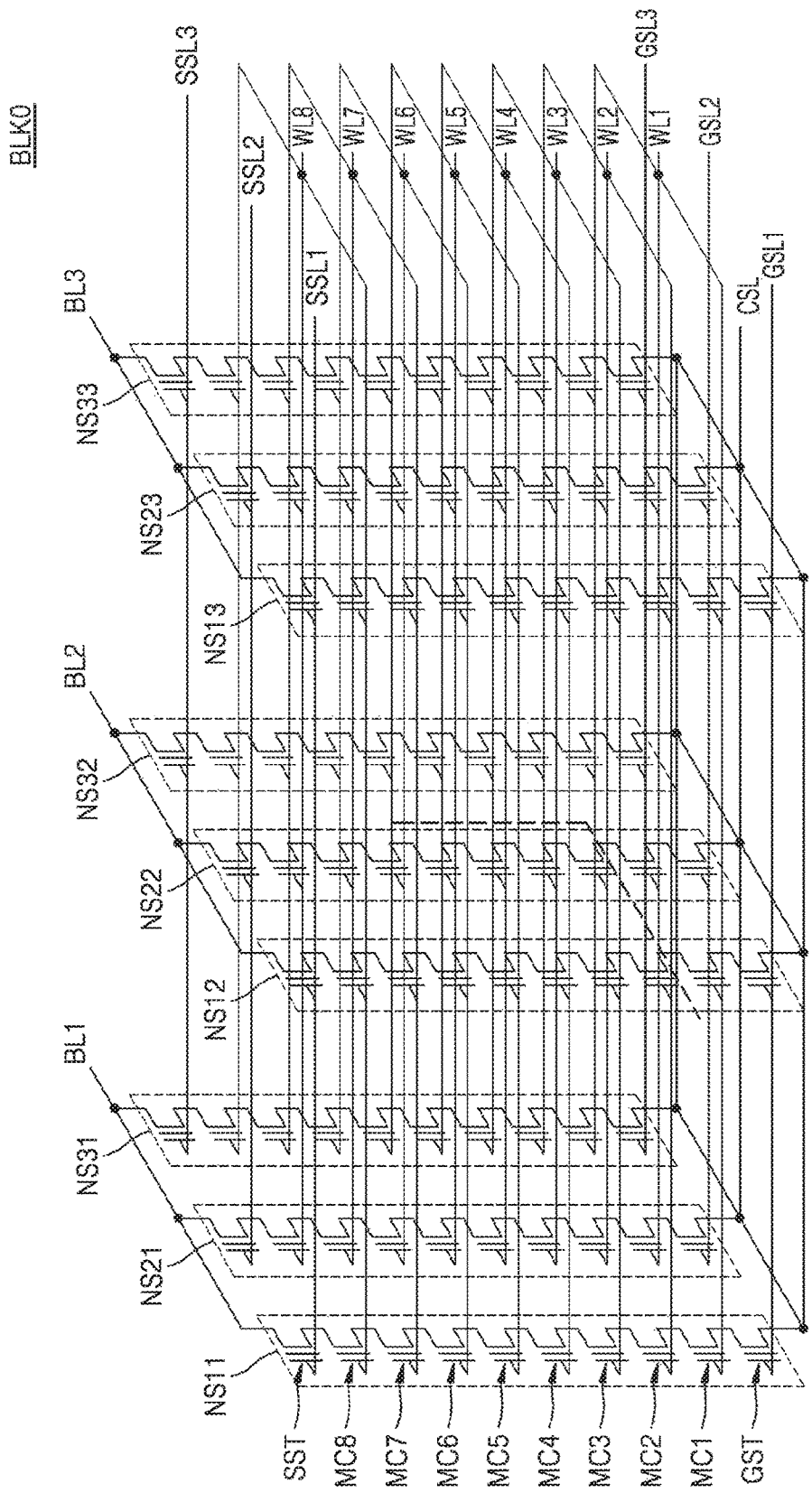
FIG. 5 is a circuit diagram of another example of the memory block included in a memory cell array, according to an embodiment of the present disclosure.

FIG. 5 is a circuit diagram of a memory block BLK0 included in a memory cell array, according to an embodiment of the present disclosure.

Referring to FIG. 5, a memory cell array (for example, 110 in FIG. 2) may be a memory cell array of a vertical NAND flash memory and include a plurality of memory blocks BLK0. Each memory block BLK0 may include a plurality of NAND strings NS11 through NS33, a plurality of word lines WL1 through WL8, a plurality of bit lines BL1 through BL3, a plurality of ground selection lines GSL1 through GSL3, a plurality of string selection lines. SSL1 through SSL3, and a common source line CSL. The numbers of NAND strings, word lines, bit lines, ground selection lines, and string selection lines may variously change depending on example embodiments.

NAND strings NS11, NS21, and NS31 may be arranged between the first bit line BL1 and the common source line CSL. NAND strings NS12, NS22, and NS32 may be arranged between the second bit line BL2 and the common source line CSL. NAND strings NS13, NS23, and NS33 may be arranged between a third bit line BL3 and the common source line CSL. Each of the NAND strings (for example, NS11) may include the string selection transistor SST, the first through eighth memory cells MC1 through MC8, and the ground selection transistor GST, which are connected in series.

Strings commonly connected to one bit line may form one column. For example, strings NS11, NS21, and NS31 commonly connected to the first bit line BL1 may correspond to a first column, strings NS12, NS22, and NS32 commonly connected to the second bit line BL2 may correspond to a second column, and strings NS13, NS23, and NS33 commonly connected to the third bit line BL3 may correspond to a third column.

Strings connected to one string selection line may form a row. For example, strings NS11, NS12, and NS13 connected to the first string selection line SSL1 may correspond to a first row, strings NS21, NS22, and NS23 connected to the second string selection line SSL2 may correspond to a second row, and strings NS31, NS32, and NS33 connected to the third string selection line SSL3 may correspond to a third row.

The string selection transistor SST may be connected to corresponding string selection lines SSL1 through SSL3. Each of the first through eighth memory cells MC1 through MC8 may be connected to corresponding word lines WL1 through WL8. The ground selection transistor GST may be connected to corresponding ground selection lines GSL1 through GSL3. The string selection transistor SST may be connected to corresponding bit lines BL1 through BL3, and the ground selection transistor GST may be connected to the common source line CSL.

Word lines on the same level (for example, WL1) may be commonly connected to each other, while string selection lines SSL1 through SSL3 may be spaced apart from each other and ground selection lines GSL1 through GSL3 may be spaced apart from each other. For example, when memory cells connected to the first word line WL1 and belonging to strings NS11, NS12, and NS13 are programmed, the first word line WL1 and the first string selection line SSL1 may be selected. The ground selection lines GSL1 through GSL3 may be commonly connected to each other.

Figure 6:
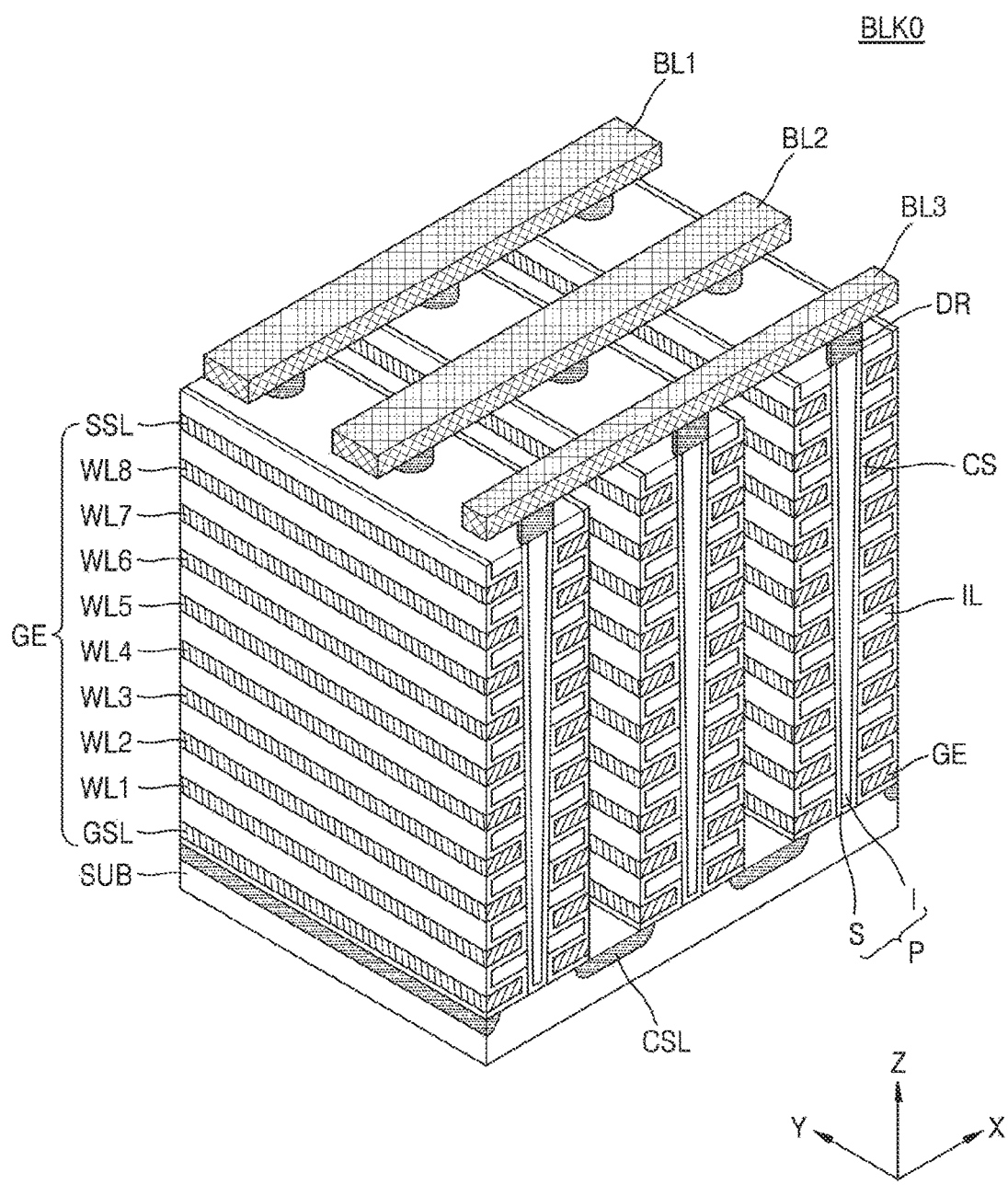
FIG. 6 is a perspective view of a memory block of FIG. 5.

FIG. 6 is a perspective view of the memory block BLK0 of FIG. 5.

Referring to FIG. 6, each memory block included in a memory cell array (for example, 110 in FIG. 2) may be formed in a vertical direction with respect to a substrate SUB. In FIG. 6, the memory block BLK0 is illustrated as including two selection lines GSL and SSL, eight word lines WL1 through WL8, and three bit lines BL1 through BL3, but the numbers thereof may actually be more or less than these numbers.

The substrate SUB may include a first conductivity type (for example, a p-type), and the common source line CSL extending thereon along a first direction (for example, a Y-direction) and a second conductivity type (for example, n-type) doped thereon may be provided. A plurality of insulating layers IL which extend along the first direction may be sequentially provided on a region of the substrate SUB between two adjacent common source lines CSL in a third direction (for example, a Z-direction), and the plurality of insulating layers IL may be separate from each other by a certain distance along the third direction. For example, the plurality of insulating layers IL may include an insulating material such as silicon oxide.

A plurality of pillars Ps may be formed which are sequentially arranged along the first direction on the region of the substrate SUB between two adjacent common source lines CSLs, and penetrate the plurality of insulating layers ILs along the third direction. For example, the plurality of pillars P may penetrate through the plurality of insulating layers IL and contact the substrate SUB. In detail, a surface layer S of each pillar P may include a silicon material of the first type, and may function as a channel region. An inner layer I of each pillar P may include an insulating material such as silicon oxide or an air gap.

A charge storage layer CS may be provided along exposed surfaces of the insulating layers IL, the pillars P, and the substrate SUB, in a region between two adjacent common source lines CSL. The charge storage layer CS may include a gate insulating layer (or "a tunnelling insulating layer"), a charge trapping layer, and a blocking insulating layer. For example, the charge storage layer CS may have an oxide-nitride-oxide (ONO) structure. In addition, a gate electrode GE including selection lines GSL and SSL and word lines WL1 through WL8 may be provided on an exposed surface of the charge storage layer CS, in a region between two adjacent common source lines CSL.

Drains or drain contacts DR may be respectively provided on the plurality of the pillars P. For example, the drains DR may include a silicon material with impurities of the second conductivity type doped thereon. The bit lines BL1 through BL3 which extend along the second direction (for example, the X-axis) and are separated from each other by a certain distance along the first direction, may be provided on the drains DR.

Figure 7:
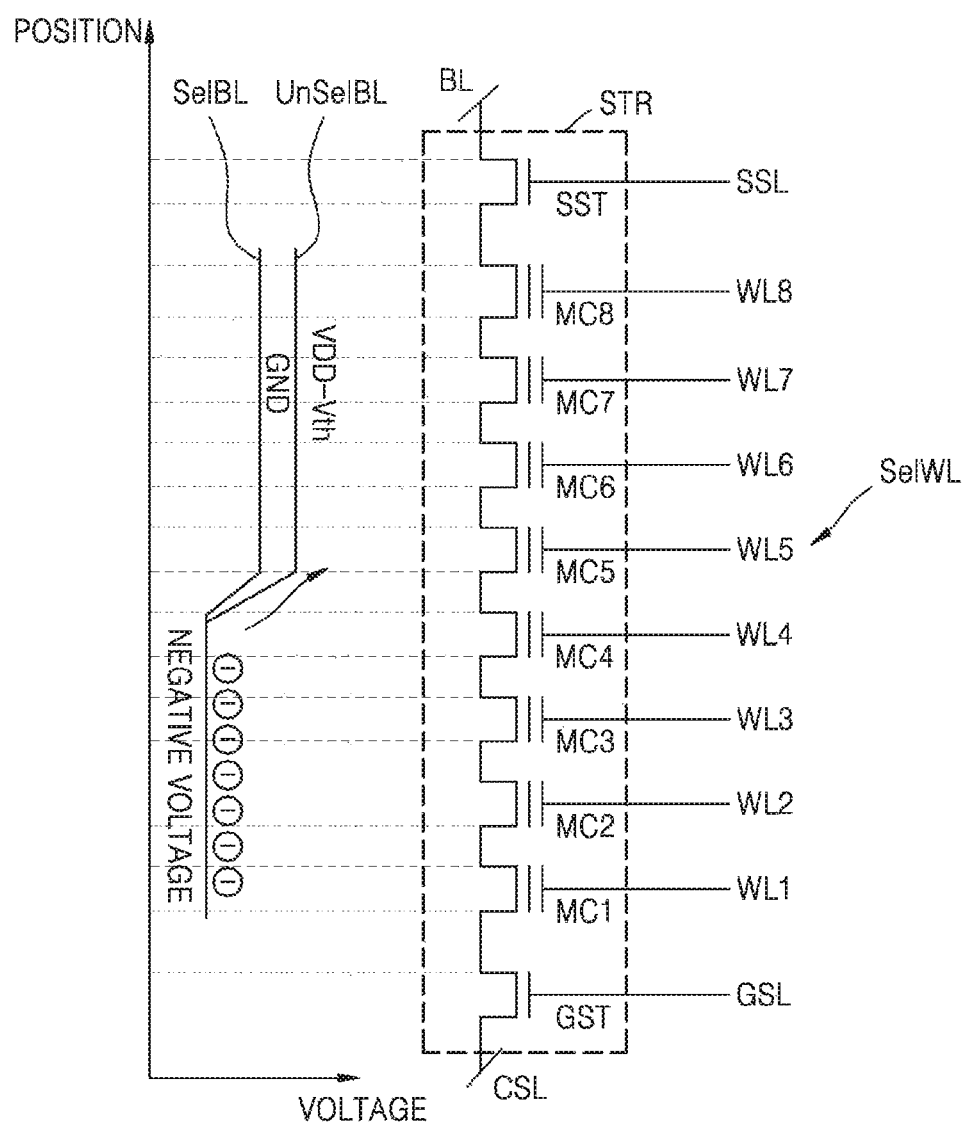
FIG. 7 is a graph of voltage potential per memory cell for describing a hot carrier injection (HCI) phenomenon.

FIG. 7 is a graph of voltage potential per memory cell for describing the HCI phenomenon.

Referring to FIG. 7, the bit line BL may be connected to a cell string STR including the string selection transistor SST, the first through eighth cells MC1 through MC8, and the ground selection transistor GST. The bit line BL may be a selected bit line SelBL or an unselected bit line UnSelBL, depending on a state of the string selection transistor SST. When the bit line BL is the selected bit line, the string selection transistor SST may have an ON state, and when the bit line BL is the unselected bit line, the string selection transistor SST may have an OFF state.

The first through eighth memory cells MC1 through MC8 may be respectively connected to corresponding first through eighth word lines WL1 through WL8, and each channel may have a certain voltage potential. FIG. 7 illustrates a graph of the voltage potential for the fifth memory cell MC5 connected to the fifth word line WL5 at a completion time of the verification step in the program operation. The fifth word line WL5 may be the selected word line SelWL, and when the bit line BL is the selected bit line, the fifth memory cell MC5 may be a program target memory cell.

The program operation may be sequentially executed from a lower word line. In other words, since the program operation is sequentially executed from the first word line WL1 to the eighth word line WL8, when the fifth word line WL5 is the selected word line SelWL for the program operation, the program operation for the first through fourth word lines WL1 through WL4 may have been completed. In the present specification, upper word lines may denote word lines WL above and including the selected word line SelWL, and the lower word lines may denote word lines WL below the selected word line SelWL. In other words, in FIG. 7, the upper word lines may denote the fifth through eighth word lines WL5 through WL8 and the lower word lines may denote the first through fourth word lines WL1 through WL4. The upper word lines may be before the program operation and thus, may be at a deletion state. The lower word lines may be after the program operation and thus, may be at a program state.

When the recovery operation is executed after the verification step, a general nonvolatile memory device may discharge voltages of the first through eighth word lines WL1 through WL8 from the verification voltage and the read voltage to the ground voltage GND. Accordingly, charges of the first through eighth word lines WL1 through WL8 may be subject to negative down coupling which is also referred to as negative boosting or under coupling. As a result, the voltages of the lower word lines WL1 through WL4 may be negative voltages due to the negative boosting.

In the case of the selected bit line SelBL, voltages of channels corresponding to the first through fourth memory cells MC1 through MC4 connected to the upper word lines WL5 through WL8 may be the ground voltage GND (for example, about 0 V) in accordance with the recovery voltage of the ground voltage GND. In the case of the unselected bit line UnSelBL, the string selection transistor SST may be changed to the ON state for inhibit boosting for a cell string STR connected to the unselected bit line UnSelBL at the recovery operation, and a power voltage VDD may be applied to the fifth through eighth memory cells MC5 through MC8 connected to the upper word lines WL5 through WL8. Accordingly, the voltage of channels corresponding to the fifth through eighth memory cells MC5 through MC8 may be a difference between the power voltage VDD and a threshold voltage Vth, or VDD–$V_{th}$.

Thus, a voltage level difference between the negative voltage of the first through fourth memory cells MC1 through MC4 and the ground voltage GND of the fifth through eighth memory cells MC5 through MC8, or the difference between the power voltage VDD and the threshold voltage Vth (VDD–$V_{th}$), may increase. In other words, as the voltage level difference increases between a memory cell corresponding to the selected word line SelWL and a memory cell adjacent thereto, memory cells in the delete state of the lower word lines WL1 through WL4 may be programmed by band-to-band tunneling (BTBT) or the HCI phenomenon. That is, program disturbance and read disturbance may occur. As the read voltage increases, and a program frequency and a read frequency are repeated, the program disturbance and the read disturbance may increase.

Figure 8:
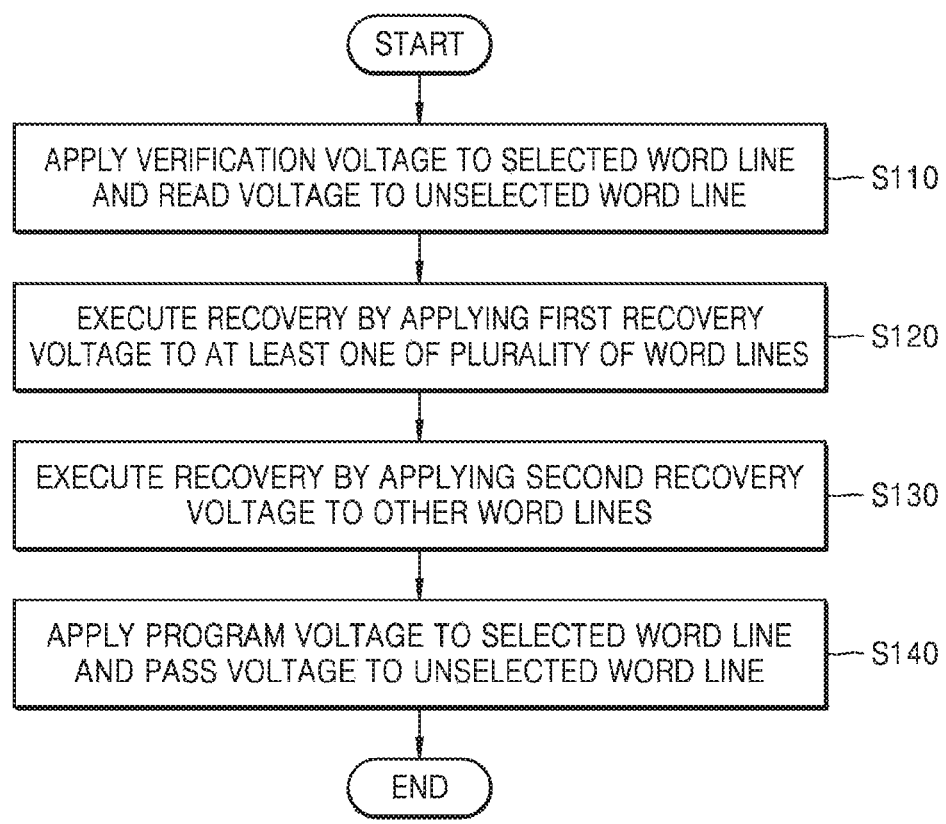
FIG. 8 is a flowchart of an operation method of a nonvolatile memory device, according to an embodiment of the present disclosure.

FIG. 8 is a flowchart of an operation method of the nonvolatile memory device 100, according to an embodiment of the present disclosure.

Referring to FIGS. 2 and 8, in the verification step S110, the nonvolatile memory device 100 may apply the verification voltage to the selected word line SelWL and apply the read voltage to the unselected word line UnSelWL. In the recovery step S120, the nonvolatile memory device 100 may execute the recovery operation by applying the first recovery voltage to at least one of the plurality of word lines WL. In addition, in the recovery step S130, the nonvolatile memory device 100 may execute the recovery operation by applying the second recovery voltage to other word lines WL. The recovery step S120 in which the recovery operation is executed by applying the first recovery voltage, and the recovery step S130 in which the recovery operation is executed by applying the second recovery voltage, may be simultaneously or sequentially executed. In a program step S140, the nonvolatile memory device 100 may apply the program voltage to the selected world line SelWL, after the recovery steps S120 and S130 have been completed, and may apply a pass voltage to the unselected word lines UnSelWL. According to an embodiment of the present disclosure, the first recovery voltage may have a higher level than about 0 V and the second recovery voltage may be the ground voltage GND of about 0 V.

Figure 9A:
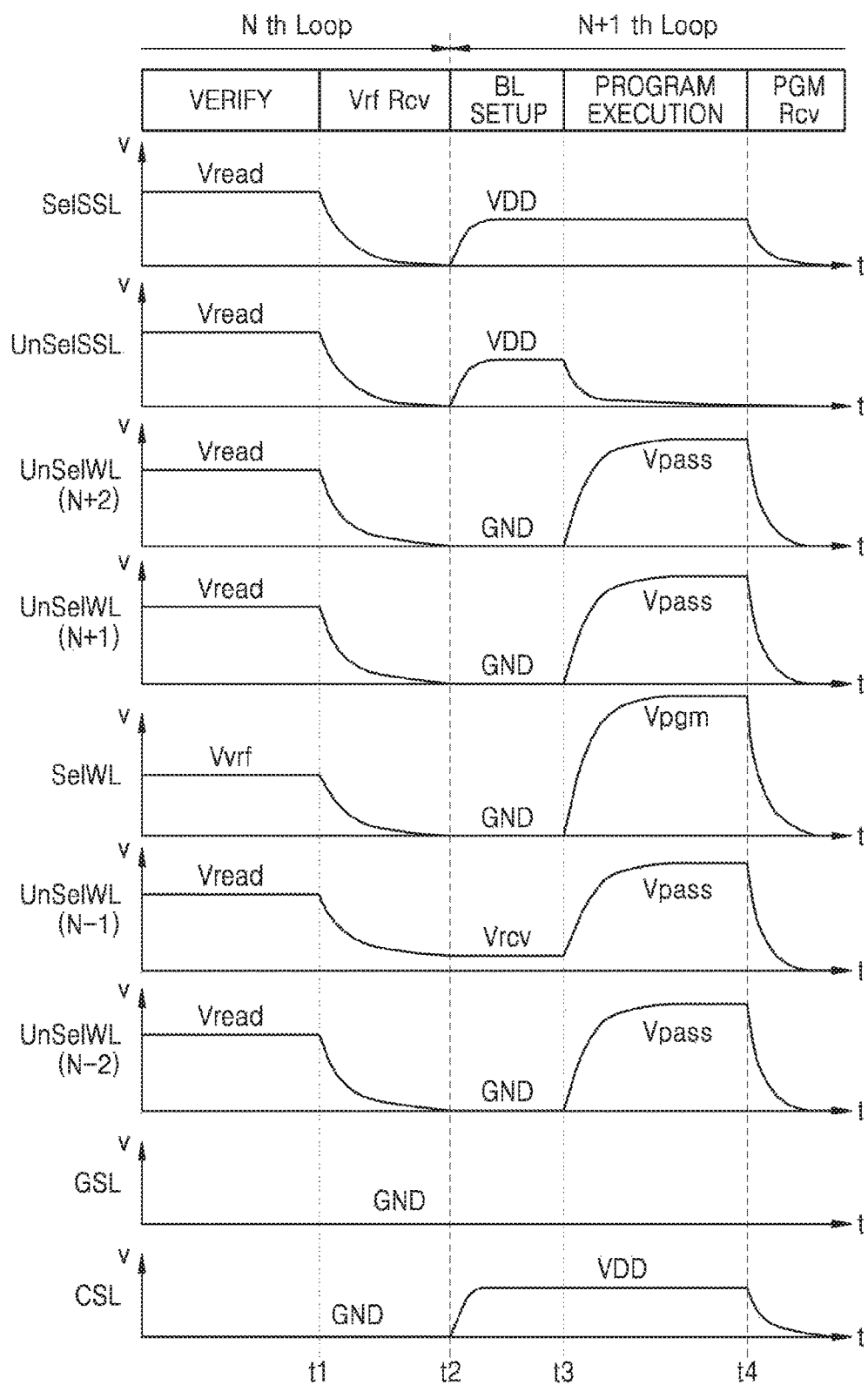
FIG. 9A is a graph of operation timing of a nonvolatile memory device, according to an embodiment of the present disclosure.

FIG. 9A is a graph of operation timing of a nonvolatile memory device, according to an embodiment of the present disclosure. FIG. 9A may be a graph of operation timing of a nonvolatile memory device in which the positive recovery is executed for an $(N-1)^{th}$ unselected word line UnSelWL(N-1).

Referring to FIG. 9A, the program operation for a memory cell of a nonvolatile memory device (for example, 100 of FIG. 2) may include a bit line setup (BL Setup) step, a program execution (Program Execution) step, a program recovery (Pgm Rcv) step, a verification (Verify) step, and a verification recovery (Vrf Rcv) step. In the present specification, the program step may denote the BL Setup step and the Program Execution step.

In the program operation for multi-level cells, more than two times of the Program Execution steps and the Verify steps may be repeatedly executed. FIG. 9A illustrates the Verify step and the Vrf Rcv step of an $N^{th}$ loop, and the BL Setup step, the program execution step, and the Pgm Rcv step of an $(N+1)^{th}$ loop. A selected string selection line SelSSL may denote a string selection line SSL connected to a cell string including the program target memory cell and an unselected string selection line UnSelSSL may denote other string selection lines SSL excluding the selected string selection line SelSSL.

In the Verify step, the nonvolatile memory device may apply the verification voltage Vvrf to the selected word line SelWL, apply the read voltage Vread to the selected string selection line SelSSL, the unselected string selection line UnSelSSL, and the unselected word lines UnSelWL (e.g., UnSelWL(N-2) through UnSelWL(N+2)), and apply the ground voltage GND to the ground selection line GSL and the common source line CSL. According to an embodiment, the read voltage Vread may have a higher voltage level than the verification voltage Vvrf.

At the Vrf Rcv step, the nonvolatile memory device may execute the recovery operation of dropping a voltage down to the recovery voltage Vrcv for the $(N-1)^{th}$ unselected word line UnSelWL(N-1) placed directly under the selected word line SelWL, and may execute the recovery operation of dropping voltages of other word lines WL down to the ground voltage GND. According to an embodiment of the present disclosure, the recovery voltage Vrcv may have a higher voltage level than the ground voltage GND.

In the BL Setup step, the nonvolatile memory device may increase voltages to the power voltage VDD for the selected string selection line SelSSL, the unselected string selection line UnSelSSL, and the common source line CSL. In addition, the nonvolatile memory device may maintain a voltage at the recovery voltage Vrcv for the $(N-1)^{th}$ unselected word line UnSelWL(N-1) and maintain voltages at the ground voltage GND for other word lines WL and the ground selection line GSL.

As described above, at the Vrf Rcv step, a voltage drop may occur from the read voltage Vread or the verification voltage Vvrf to the ground voltage GND or the recovery voltage Vrcv. Subsequently, the negative boosting may occur due to discharging for memory cells connected to the word lines SelWL, UnSelWL(N-2), UnSelWL(N-1), UnSelWL(N+1), and UnSelWL(N+2). According to an embodiment of the present disclosure, in the Vrf Rcv step, the nonvolatile memory device may execute a positive recovery to the recovery voltage Vrcv higher than the ground voltage GND for the $(N-1)^{th}$ unselected word line UnSelWL(N-1). Since a difference between the read voltage Vread and the recovery voltage Vrcv is less than a difference between the read voltage Vread and the ground voltage GND, the voltage level for the memory cell connected to the $(N-1)^{th}$ unselected word line UnSelWL(N-1) may be higher than that for the memory cell connected to an $(N-2)^{th}$ unselected word line UnSelWL(N-2), after the negative boosting has been completed. Accordingly, the voltage potential difference between the selected word line SelWL and the $(N-1)^{th}$ unselected word line UnSelWL(N-1) may be reduced. Detailed descriptions of this issue will be provided later in FIG. 9B.

In the Program Execution step, the nonvolatile memory device may maintain the power voltage VDD for the selected string selection line SelSSL and drop the voltage to the ground voltage GND for the unselected string selection line UnSelSSL. Accordingly, the string selection transistor SST having the selected string selection line SelSSL connected thereto may be transitioned to the ON state. Hereinafter, the string selection transistor SST having the selected string selection line SelSSL connected thereto will be denoted as a selected string selection transistor SelSST. In addition, the nonvolatile memory device may apply the pass voltage Vpass to the unselected word lines UnSelWL(N-2), UnSelWL(N-1), UnSelWL(N+1), and UnSelWL(N+2), and the program voltage Vpgm to the selected word line SelWL. Accordingly, memory cells connected to the selected word line SelWL and the selected string selection transistor SelSST may be programmed.

At the Pgm Rcv step, the nonvolatile memory device may drop voltage levels for all lines to the ground voltage GND and execute the Verification step for the $(N+1)^{th}$ loop.

Figure 9B:
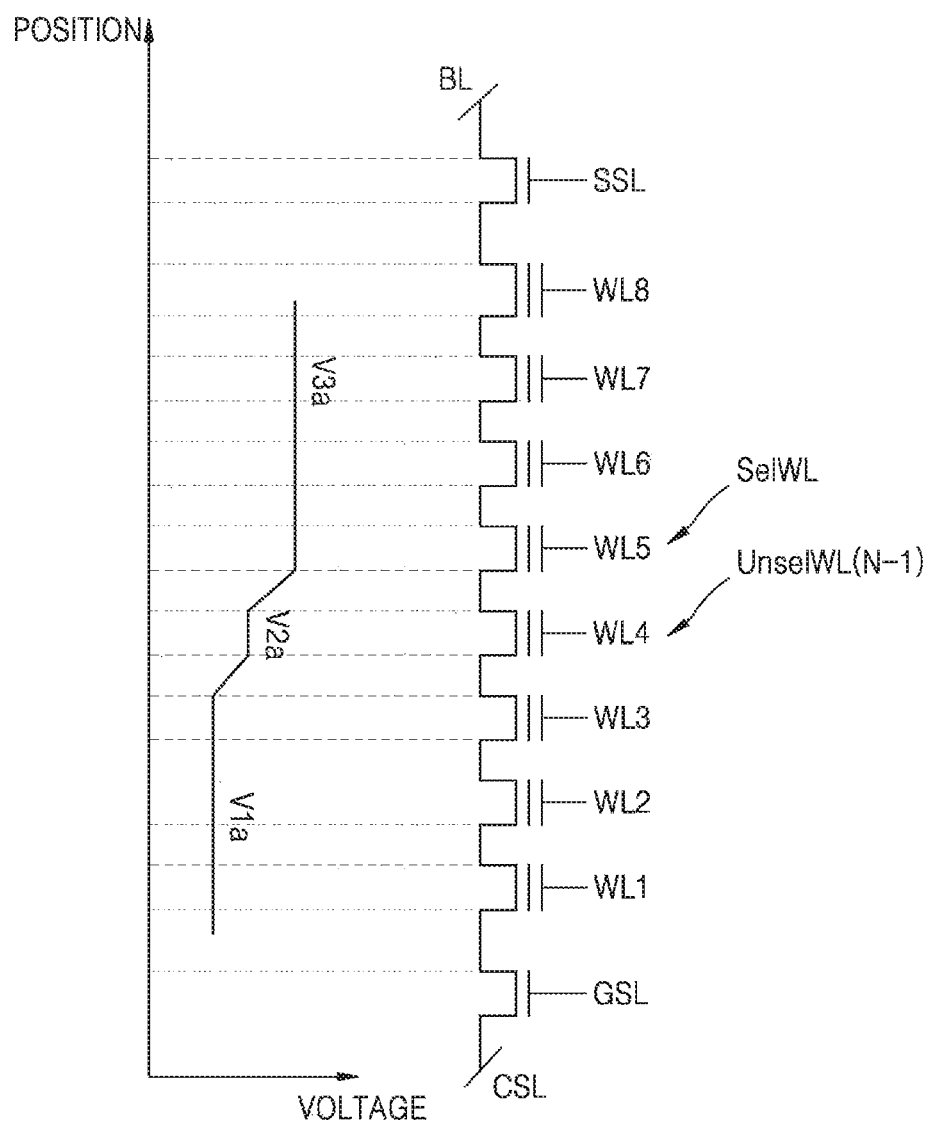
FIG. 9B is a graph of voltage potential of a cell string, according to an embodiment of the present disclosure.

FIG. 9B is a graph of voltage potential of a cell string, according to an embodiment of the present disclosure. More particularly, FIG. 9B is a graph of the voltage potential of a cell string at a time t2 in FIG. 9A.

Referring to FIGS. 9A and 9B, the first through third word lines WL1 through WL3 may have a first voltage level V1a, the fourth word line WL4 may have a second voltage level V2a, and the fifth through eighth word lines WL5 through WL8 may have a third voltage level V3a. The first voltage level V1a may be lower than the second voltage level V2a, and the second voltage level V2a may be lower than the third voltage level V3a. The first voltage level V1a may be equal to or lower than about 0 V. In addition, FIG. 9B may represent a case in which the bit line BL is a selected bit line or an unselected bit line. When the bit line BL is the selected bit line, the third voltage level V3a may be the ground voltage GND, and when the bit line BL is the unselected bit line, the third voltage level V3a may be the difference voltage level (VDD-$V_{th}$) between the power voltage VDD and the threshold voltage $V_{th}$ of a memory cell. This issue has been described in reference to FIG. 7, and thus, descriptions thereof will be omitted.

According to an embodiment, a case may be illustrated in which the $(N-1)^{th}$ unselected word line UnSelWL directly under the selected word line SelWL is the fourth word line WL4. In other words, a case may be described in which the fifth word line WL5 is the selected word line SelWL and the positive recovery is executed for the fourth word line WL4. As illustrated in FIG. 9A, in the Vrf Rcv step, since a voltage drop difference of the fourth word line WL4 is less than that of the first through third word lines WL1 through WL3, an effect on the fourth word line WL4 due to the negative boosting may be less than that on the first through third word lines WL1 through WL3. At the time t2 when the Vrf Rcv step has been completed, the voltage level of the fourth word line WL4 may be higher than that of the first through third word lines WL1 through WL3. Accordingly, the second voltage level V2a of the fourth word line WL4 at t2 may be higher than the first voltage level V1a of the first through third word lines WL1 through WL3, and thus, a difference between the third voltage level V3a and the second voltage level V2a may be less than that between the third voltage level V3a and the first voltage level V1a. In other words, according to the present disclosure, since the voltage level difference between the upper word lines WL5 through WL8 and the lower word lines WL1 through WL4, which is the cause of the HCI phenomenon, is reduced, the HCI phenomenon may be prevented and the program disturb may be reduced.

In FIG. 9B, eight memory cells are illustrated. However, this is only an example, and the present disclosure may be applicable to a case in which the number of memory cells is more or less than eight.

Figure 10A:
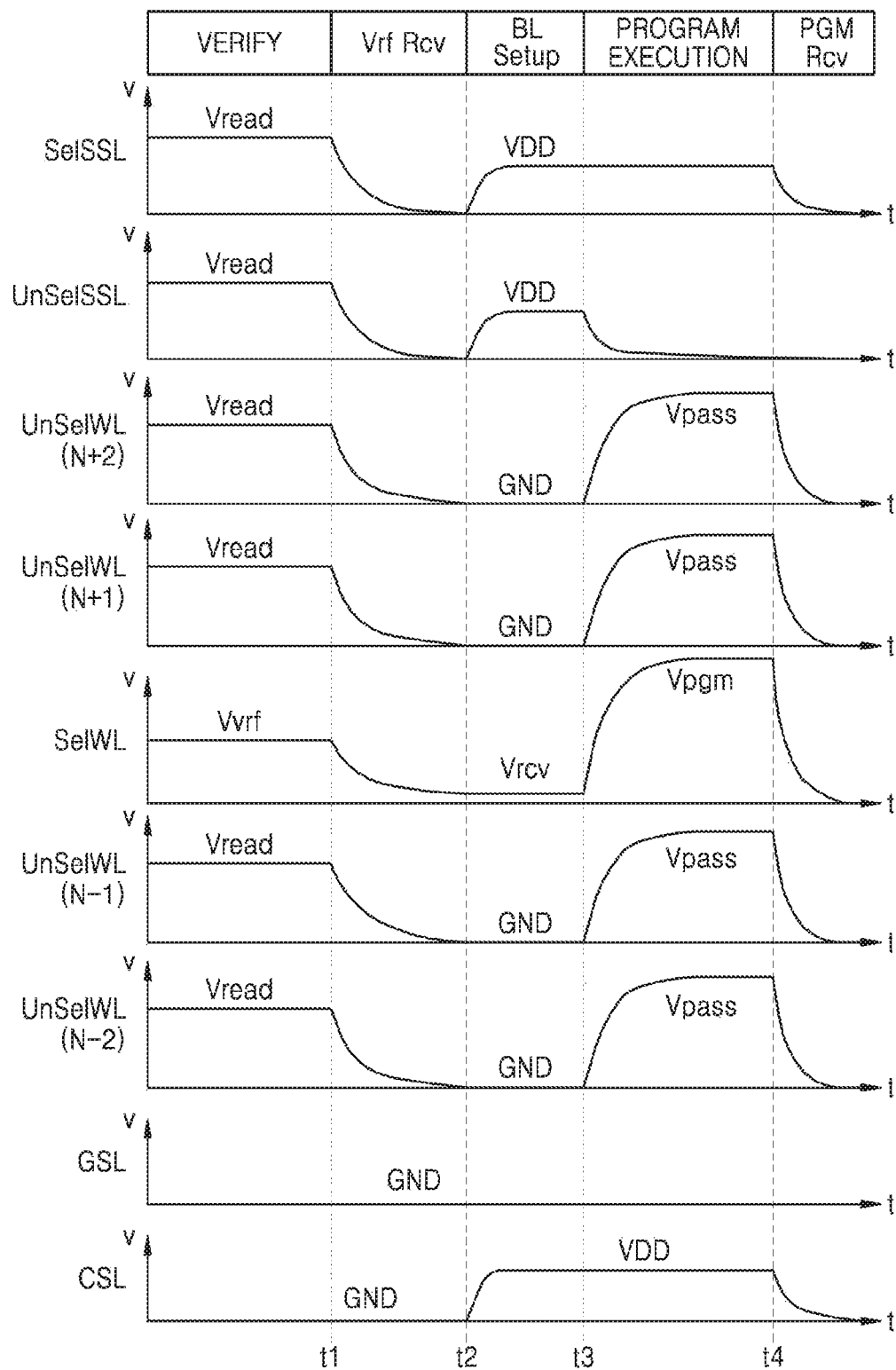
FIG. 10A is a graph of operation timing of a nonvolatile memory device, according to an embodiment of the present disclosure.

FIG. 10A is a graph of operation timing of a nonvolatile memory device, according to an embodiment of the present disclosure. Descriptions of content overlapping with that in FIG. 9A will be omitted.

FIG. 10A, unlike FIG. 9A, illustrates a case in which the positive recovery is executed for the selected word line SelWL, and not for the $(N-1)^{th}$ unselected word line UnSel-WL(N-1). Thus, excluding the described difference, other operations may be the same as or similar to those in FIG. 9A, and thus, descriptions thereof will be omitted.

At the Vrf Rcv step, the nonvolatile memory device may execute the recovery operation of dropping a voltage to the recovery voltage Vrcv for the selected word line SelWL and may execute the recovery operation of dropping voltages to the ground voltage GND for other word lines WL. According to an embodiment of the present disclosure, the recovery voltage Vrcv may have a higher voltage level than the ground voltage GND.

In the BL Setup step, the nonvolatile memory device may maintain the recovery voltage Vrcv for the selected word line SelWL and the ground voltage GND for other word lines WL. According to an embodiment of the present disclosure, in the Vrf Rcv step, the nonvolatile memory device may execute the positive recovery for the selected word line SelWL with the recovery voltage Vrcv higher than the ground voltage GND. Since a difference between the verification voltage Vvrf and the recovery voltage Vrcv is less than that between the verification voltage Vvrf and the ground voltage GND, the voltage level of the selected word line SelWL at the time of completion of the Vrf Rcv step may be lower than that of the case in FIG. 7. Accordingly, the voltage potential difference between the selected word line SelWL and the $(N-1)^{th}$ unselected word line UnSelWL(N-1) may be reduced. Detailed descriptions thereof will be provided later with reference to FIG. 10B.

Figure 10B:
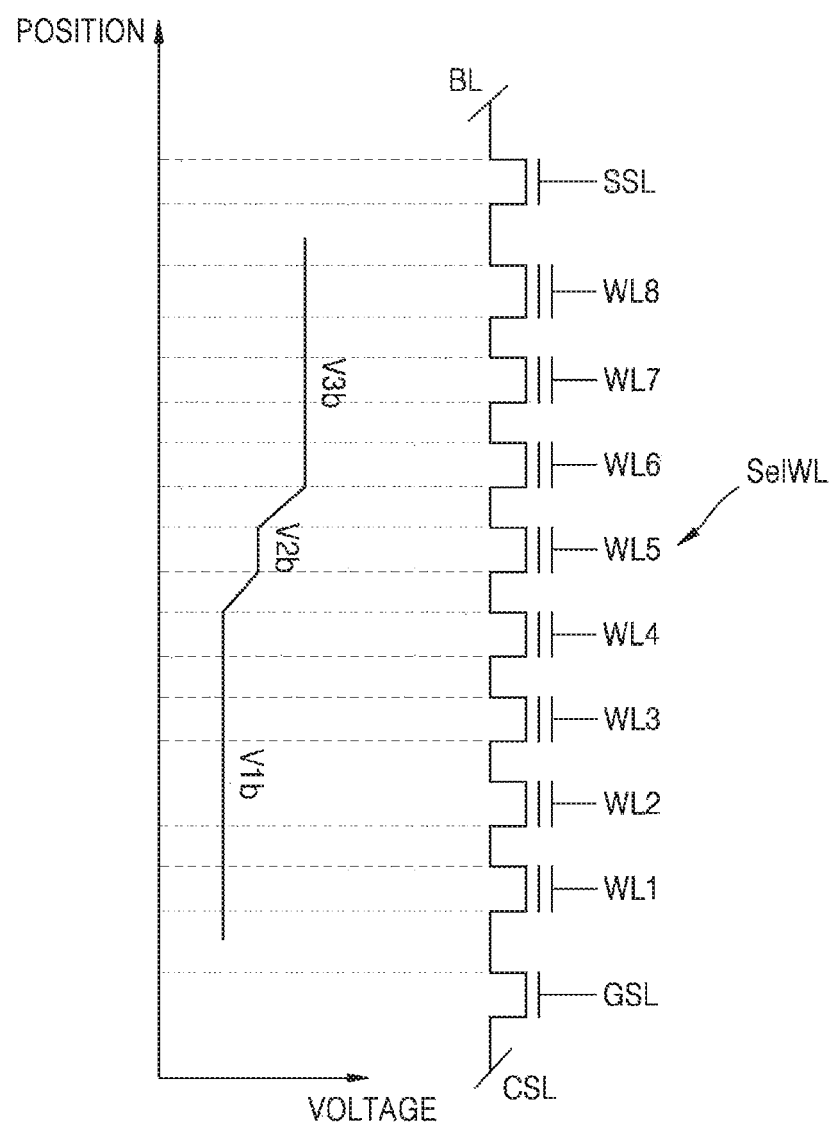
FIG. 10B is a graph of voltage potential of a cell string, according to an embodiment of the present disclosure.

FIG. 10B is a graph of voltage potential of a cell string, according to an embodiment of the present disclosure. FIG. 10B may be a graph of the voltage potential of a cell string at the time t2 in FIG. 10A. Descriptions of content overlapping with that in FIG. 9A will be omitted.

Referring to FIGS. 10A and 10B, the first through fourth word lines WL1 through WL4 may have a first voltage level V1b, the fifth word line WL5 may have a second voltage level V2b, and the sixth through eighth word lines WL6 through WL8 may have a third voltage level V3b. The first voltage level V1b may be lower than the second voltage level V2b and the second voltage level V2b may be lower than the third voltage level V3b.

According to an embodiment, a case may be described in which the selected word line SelWL is the fifth word line WL5 and the positive recovery is executed for the fifth word line WL5. As described in FIG. 10A, the difference between the verification voltage Vvrf and the recovery voltage Vrcv is less than that between the verification voltage Vvrf and the ground voltage GND, and the voltage level of the fifth word line WL5 at the time t2 when the Vrf Rcv step is completed may be lower than that of the case in FIG. 7. Accordingly, the fifth word line WL5 may have the third voltage level V3b which is the same as that of the sixth word line WL6 in the case of FIG. 7. However, according to an embodiment, the fifth word line WL5 may have the second voltage level V2b which is lower than the third voltage level V3b, and the difference between the second voltage level V2b and the first voltage level V1b may be less than that between the second voltage level V2b and the third voltage level V3b. According to an embodiment of the present disclosure, since the cause of the HCI phenomenon or the voltage level difference between the upper word lines WL5 through WL8 and the lower word lines WL1 through WL4 is reduced, the HCI phenomenon may be prevented and the program disturb may be reduced.

In FIG. 10B, eight memory cells are illustrated. However, this is only an example, and the present disclosure may be applicable to a case in which the number of memory cells more or less than eight.

Figure 11:
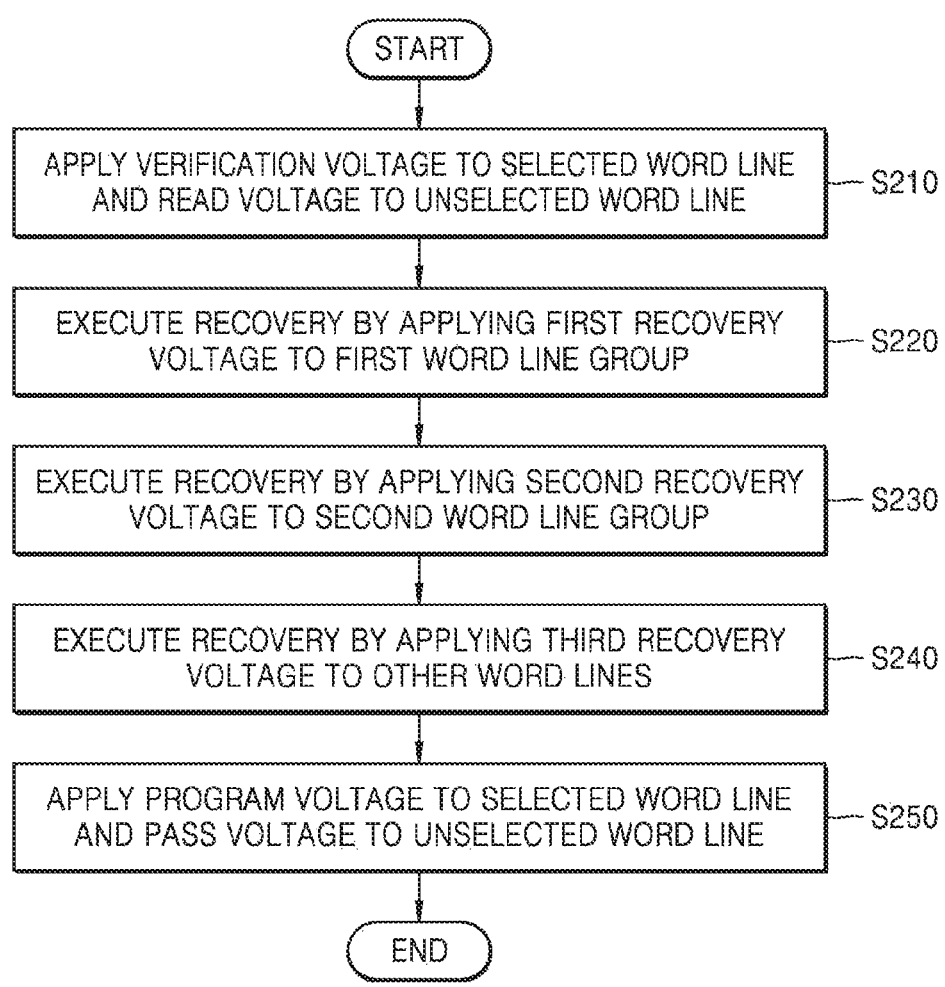
FIG. 11 is a flowchart of an operation method of a nonvolatile memory device, according to an embodiment of the present disclosure.

FIG. 11 is a flowchart of an operation method of a nonvolatile memory device, according to an embodiment of the present disclosure.

Referring to FIGS. 2 and 11, in the Verification step (S210), the nonvolatile memory device 100 may apply the verification voltage to the selected word line SelWL and the read voltage to the unselected word line UnSelWL. The nonvolatile memory device 100 may execute the recovery operation by applying the first recovery voltage for a first word line group among the plurality of word lines (S220). In addition, the nonvolatile memory device 100 may execute the recovery operation by applying the second recovery voltage to a second word line group among the plurality of word lines (S230), and may execute the recovery operation by applying a third recovery voltage to other word lines excluding the first and second word line groups (S240). The step of executing the recovery operation by applying the first recovery voltage (S220), the step of executing the recovery operation by applying the second recovery voltage (S230), and the step of executing the recovery operation by applying the third recovery voltage (S240) may be simultaneously or sequentially executed. After the recovery operations (S220, S230, and S240) have been completed, the nonvolatile memory device 100 may apply the program voltage to the selected word line SelWL and apply the pass voltage to the unselected word line UnSelWL, through the program step (S250). According to an embodiment of the present disclosure, the first and second recovery voltages may have a higher level than about 0 V, and the third recovery voltage may be the ground voltage GND of about 0 V.

Figure 12A:
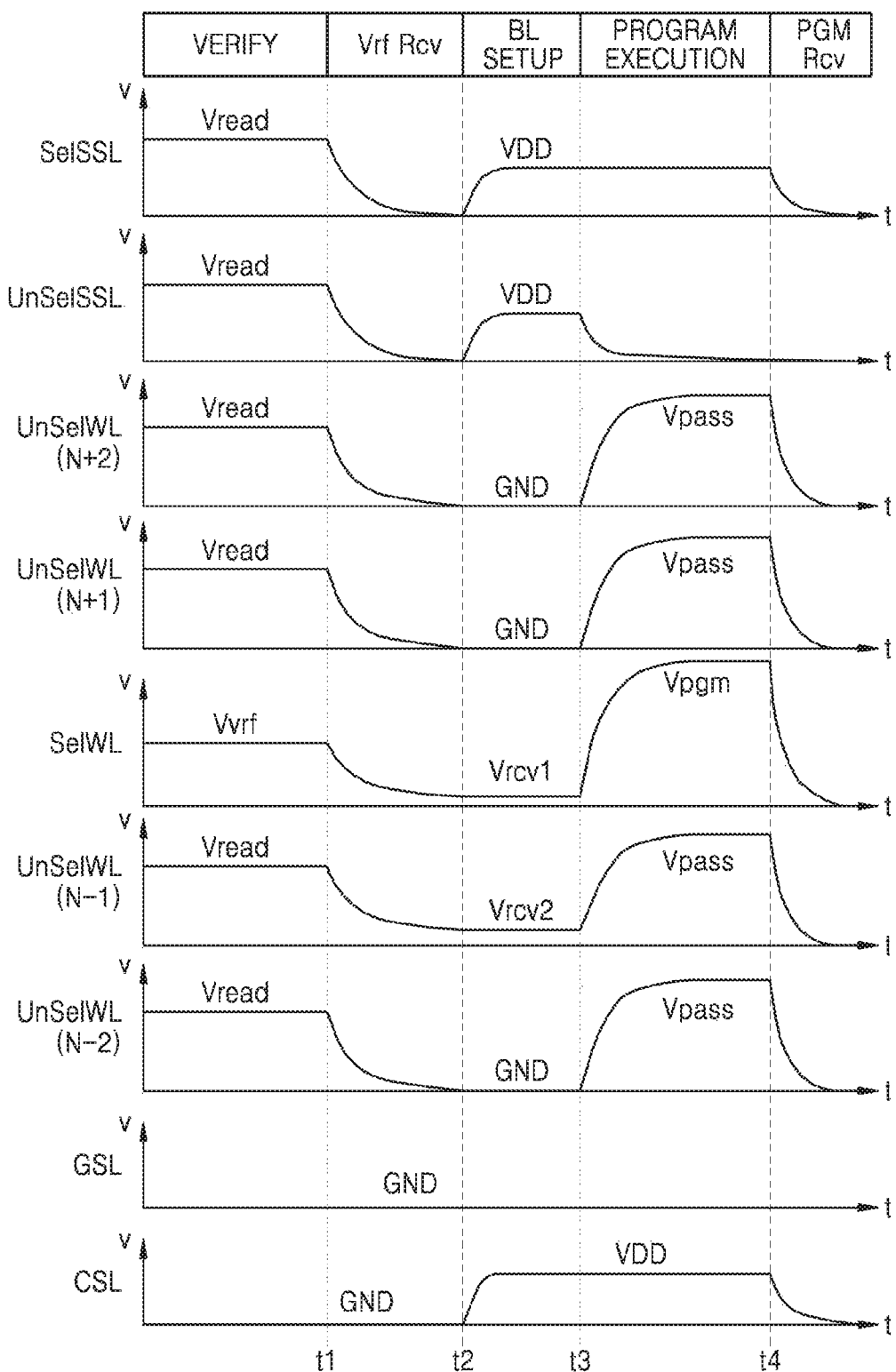
FIG. 12A is a graph of operation timing of a nonvolatile memory device, according to an embodiment of the present disclosure.

FIG. 12A is a graph of operation timing of a nonvolatile memory device, according to an embodiment of the present disclosure. Descriptions of content overlapping with that in FIG. 9A will be omitted.

FIG. 12A, unlike FIG. 9A, illustrates a case in which the positive recovery is executed for the selected word line SelWL and the $(N-1)^{th}$ unselected word line UnSelWL(N-1). Thus, except the described difference, other operations may be the same as or similar to those in FIG. 9A, and thus, descriptions thereof will be omitted.

In the Vrf Rcv step, the nonvolatile memory device may execute the first recovery operation of dropping a voltage to the first recovery voltage Vrcv1 for the selected word line SelWL, execute the second recovery operation of dropping a voltage to the second recovery voltage Vrcv2 for the $(N-1)^{th}$ unselected word line UnSelWL(N-1) placed directly under the selected word line SelWL, and execute the third recovery operation of dropping a voltage to the ground voltage GND for other word lines WL. According to an embodiment of the present disclosure, the first and second recovery voltages Vrcv1 and Vrcv2 may have a higher voltage level than the ground voltage GND.

In the BL Setup step, the nonvolatile memory device may maintain the first recovery voltage Vrcv1 for the selected word line SelWL, the second recovery voltage Vrcv2 for the $(N-1)^{th}$ unselected word line UnSelWL(N-1), and the ground voltage GND for other word lines. According to an embodiment of the present disclosure, in the Vrf Rcv step, the nonvolatile memory device may execute the positive recovery for the selected word line SelWL and the $(N-1)^{th}$ unselected word line UnSelWL(N-1) with the first and second recovery voltages Vrcv1 and Vrcv2 that are higher than the ground voltage GND. Since respective differences of the read voltage Vread and the verification voltage Vvrf from the first and second recovery voltages Vrcv1 and Vrcv2 may be less than those from the ground voltage GND, after the negative boosting has been completed, the voltage level for a memory cell connected to the $(N+1)^{th}$ unselected word line UnSelWL(N+1) may be higher than the selected word line SelWL, and the voltage level of a memory cell connected to the $(N-1)^{th}$ unselected word line UnSelWL(N-1) may be higher than that of a memory cell connected to the $(N-2)^{th}$ unselected word line UnSelWL(N-2). Accordingly, the potential difference between the selected word line SelWL and the $(N-1)^{th}$ unselected word line UnSelWL(N-1) may be reduced. Detailed descriptions on this issue will be provided later with reference to FIG. 12B.

According to an embodiment in FIG. 12A, a case is described in which respective recovery operations are executed for two lines, that is, the selected word line SelWL and the $(N-1)^{th}$ unselected word line UnSelWL(N-1). However, the embodiment is not limited thereto. It will be understood by one of ordinary skill in the art the content described above may be similarly applied for executing the recovery operation for three word lines or more including the selected word line SelWL and at least one of the lower word lines.

Figure 12B:
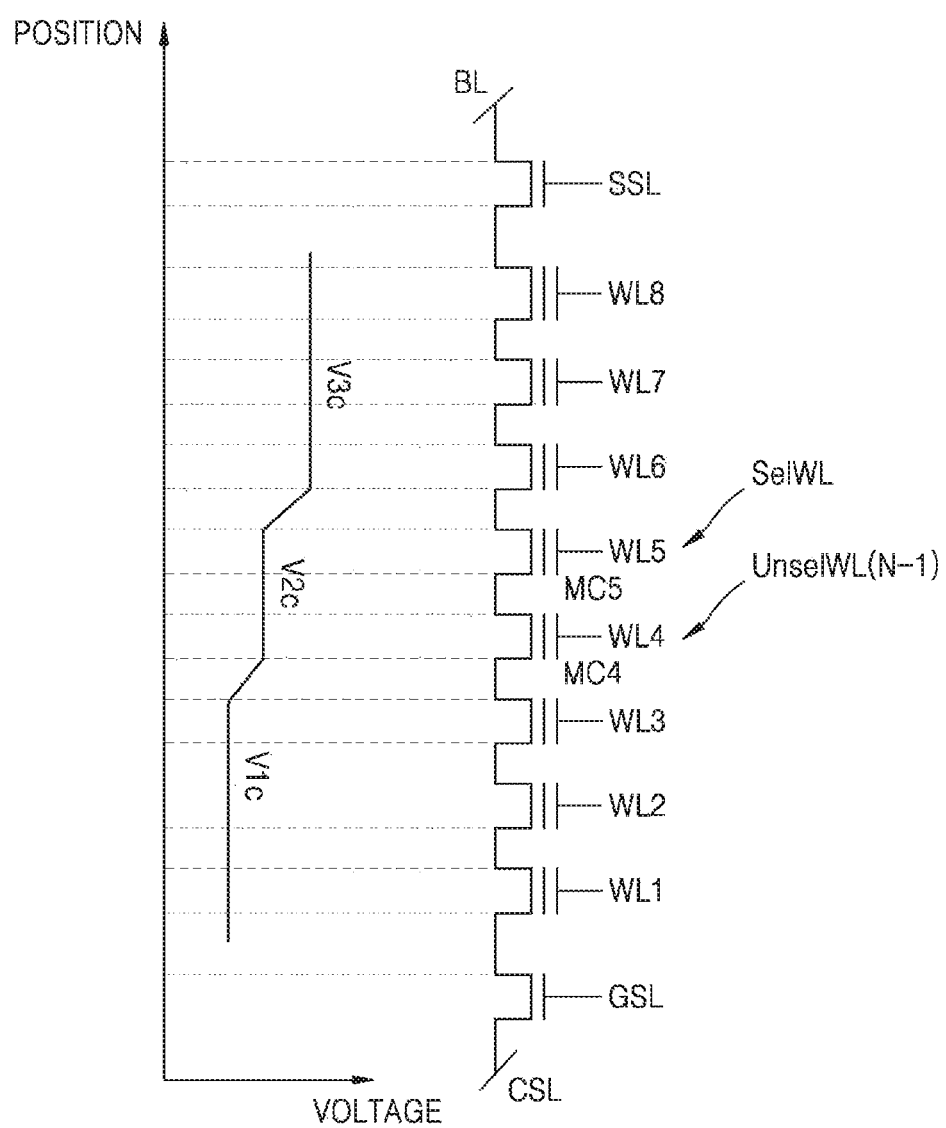
FIG. 12B is a graph of voltage potential of a cell string, according to an embodiment of the present disclosure.

FIG. 12B is a graph of voltage potential of a cell string, according to an embodiment of the present disclosure. FIG. 12B may be a graph of the voltage potential of a cell string at the time t2 in FIG. 12A. Descriptions of content overlapping with that in FIG. 9A will be omitted.

Referring to FIGS. 12A and 12B, the first through third word lines WL1 through WL3 may have a first voltage level V1c, the fourth and fifth word lines WL4 and WL5 may have a second voltage level V2c, and the sixth through eighth word lines WL6 through WL8 may have a third voltage level V3c. The first voltage level V1c may be lower than the second voltage level V2c, and the second voltage level V2c may be lower than the third voltage level V3c.

FIG. 12B illustrates a case in which the selected word line SelWL is the fifth word line WL5, the positive recovery is executed for the fifth word line WL5 with the first recovery voltage Vrcv1, and the positive recovery is executed for the fourth word line WL4 with the second recovery voltage Vrcv1. In addition, FIG. 12B, unlike FIG. 12C to be described later, illustrates a case in which the threshold voltage Vth of the fifth memory cell MC5 connected to the fifth word line WL5 is higher than or equal to the threshold voltage Vth of the fourth memory cell MC4 connected to the fourth word line WL4. However, the embodiment is not limited thereto.

As described in FIG. 12A, after the negative boosting is complete, since respective differences of the read voltage Vread and the verification voltage Vvrf from the recovery voltage Vrcv may be less than those from the ground voltage GND, the voltage level for the memory cell connected to the sixth word line WL6 may be higher than that for the memory cell connected to the fifth word line WL5, and the voltage level for the memory cell connected to the fourth word line WL4 may be higher than that for the memory cell connected to the third word line WL3. Accordingly, a horizontal section in the voltage level between memory cells may be generated more than one time, and thus, the voltage level difference between adjacent memory cells may be reduced. In other words, according to an embodiment of the present disclosure, since the voltage level difference between adjacent memory cells, which is a cause of the HCI phenomenon, may be reduced, the HCI phenomenon may be prevented and the program disturb may be reduced.

Figure 12C:
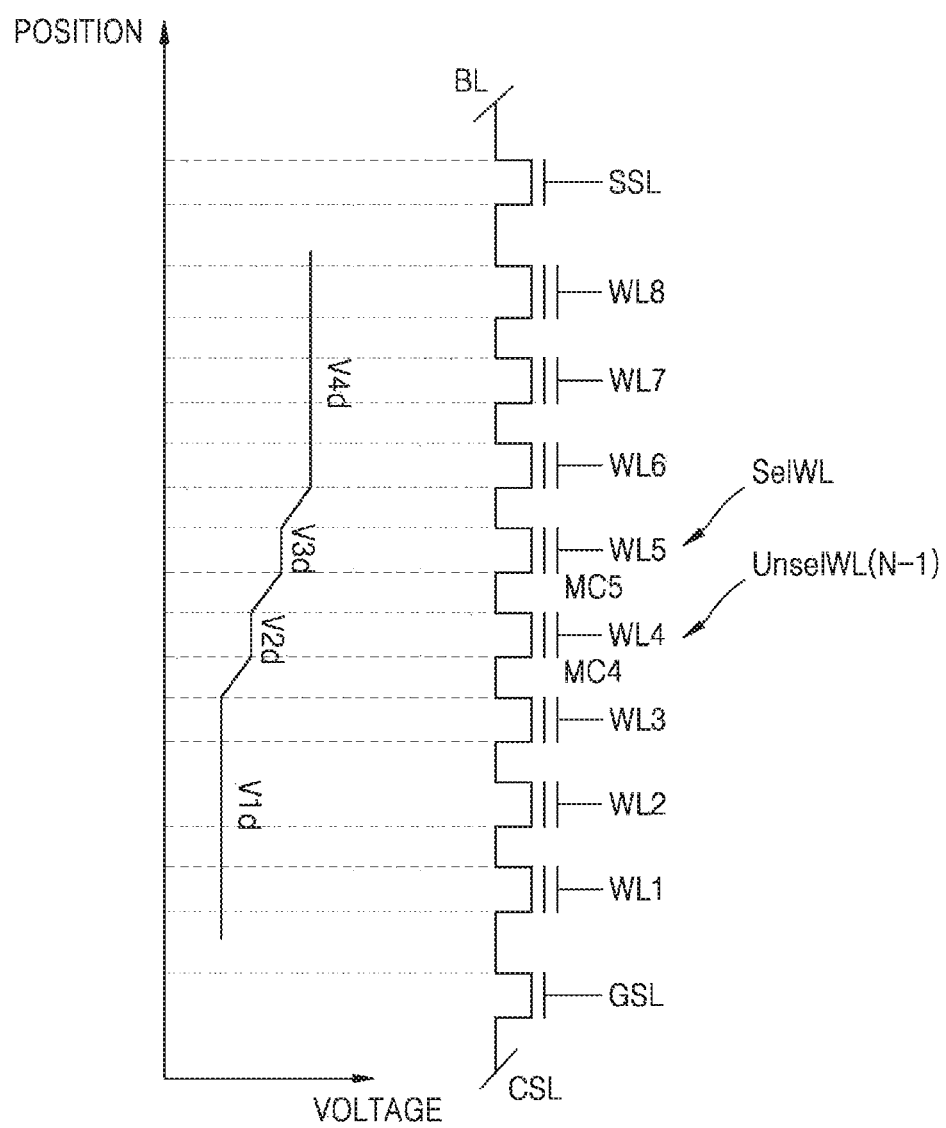
FIG. 12C is a graph of voltage potential of a cell string, according to an embodiment of the present disclosure.

FIG. 12C is a graph of voltage potential of a cell string, according to an embodiment of the present disclosure. FIG. 12C may be a graph of the voltage potential of a cell string at the time t2 in FIG. 12A. Descriptions of content overlapping with that in FIG. 12B will be omitted.

Referring to FIGS. 12A and 12C, the first through third word lines WL1 through WL3 may have a first voltage V1d, the fourth word line WL4 may have a second voltage level V2d, the fifth word line WL5 may have a third voltage level V3d, and the sixth through eighth word lines WL6 through WL8 may have a fourth voltage level V4d. The first voltage level V1d may be lower than the second voltage level V2d, the second voltage level V2d may be lower than the third voltage level V3d, and the third voltage level V3d may be lower than the fourth voltage level V4d.

FIG. 12C illustrates a case in which the selected word line SelWL is the fifth word line WL5, the positive recovery is executed for the fifth word line WL5 with the first recovery voltage Vrcv1, and the positive recovery is executed for the fourth word line WL4 with the second recovery voltage Vrcv2. FIG. 12C, unlike FIG. 12B described above, illustrates a case in which the threshold voltage $V_{th}$ of the fifth memory cell MC5 connected to the fifth word line WL5 is lower than that of the fourth memory cell MC4 connected to the fourth word line WL4 or a case in which the first recovery voltage Vrcv1 has a higher voltage level than the second recovery voltage Vrcv2. However, the embodiment is not limited thereto. In the embodiment of FIG. 12C, unlike FIG. 12B, the second voltage level V2d may be lower than the third voltage level V3d due to the differences described above.

After the negative boosting has been completed, the voltage level of the memory cell connected to the sixth word line WL6 may be higher than that of the memory cell connected to the fifth word line WL5, and the voltage level of the memory cell connected to the fourth word line WL4 may be higher than that of the memory cells connected to the third word line WL3. Accordingly, two horizontal sections in the voltage level between memory cells may be further generated, and thus, the voltage level difference between adjacent memory cells may be reduced. In other words, according to an embodiment of the present disclosure, since the voltage level difference between adjacent memory cells, which is the cause of the HCI phenomenon, may be reduced, the HCI phenomenon may be prevented and the program disturb may be reduced.

Figure 13A:
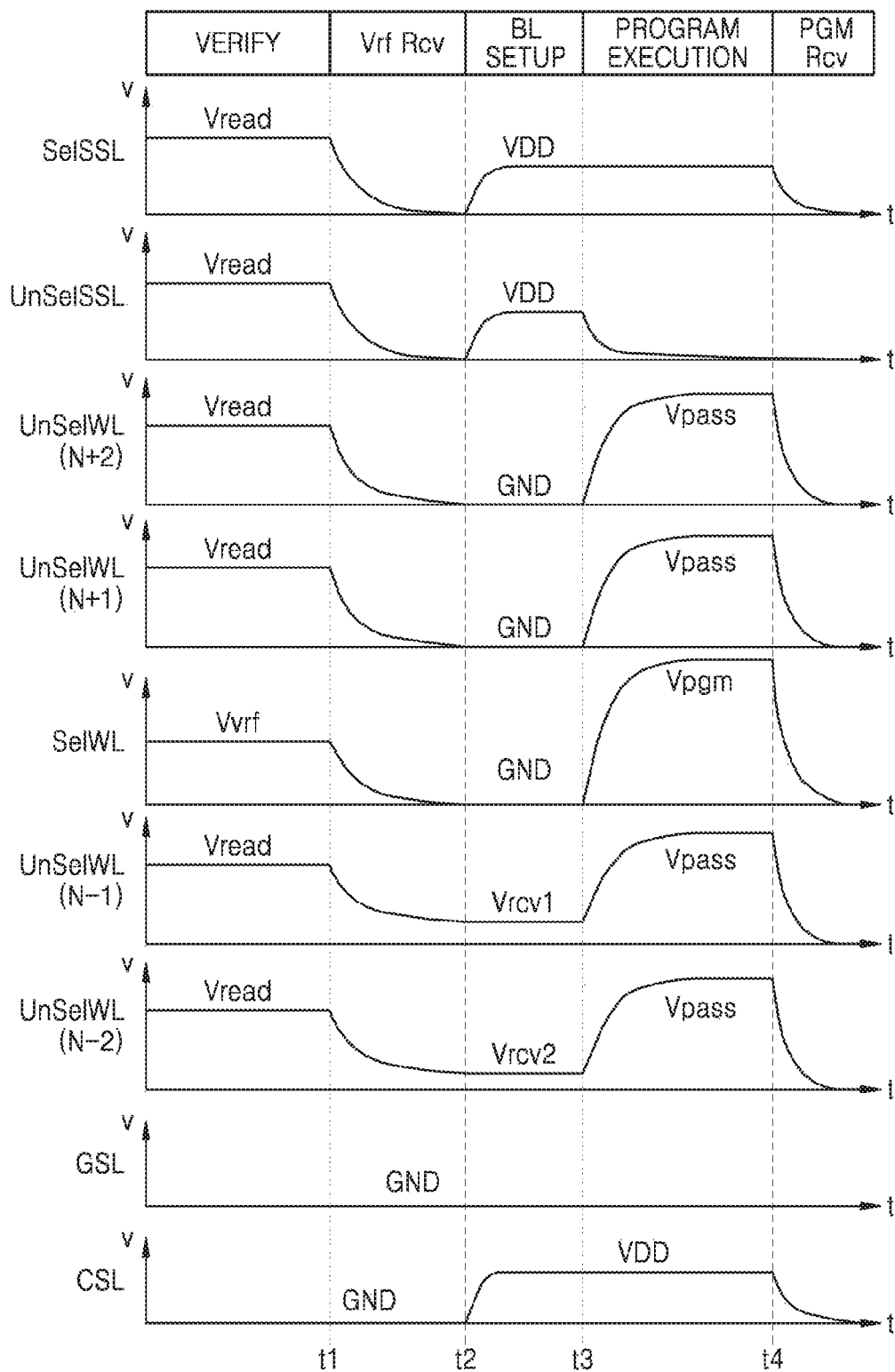
FIG. 13A is a graph of operation timing of a nonvolatile memory device, according to an embodiment of the present disclosure.

FIG. 13A is a graph of operation timing of a nonvolatile memory device, according to an embodiment of the present disclosure. Descriptions of content overlapping with that in FIG. 12A will be omitted.

FIG. 13A, unlike FIG. 12A, illustrates a case in which the positive recovery is executed for the $(N-1)^{th}$ unselected word line UnSelWL(N-1) and the $(N-2)^{th}$ unselected word line UnSelWL(N-2). Thus, except the described difference, other operations may be the same as or similar to those in FIG. 12A, and thus, descriptions thereof will be omitted.

In the Vrf Rcv step, the nonvolatile memory device may execute the first recovery operation of dropping a voltage to the first recovery voltage Vrcv1 for the $(N-1)^{th}$ unselected word line UnSelWL(N-1), execute the second recovery operation of dropping a voltage to the second recovery voltage Vrcv2 for the $(N-2)^{th}$ unselected word line UnSelWL(N-2) placed directly under the selected word line SelWL, and execute the third recovery operation of dropping a voltage to the ground voltage GND for other word lines WL. According to an embodiment of the present disclosure, the first and second recovery voltages Vrcv1 and Vrcv2 may have a higher voltage level than the ground voltage GND.

In the BL Setup step, the nonvolatile memory device may maintain the first recovery voltage Vrcv1 for the $(N-1)^{th}$ unselected word line UnSelWL(N-1), the second recovery voltage Vrcv2 for the $(N-2)^{th}$ unselected word line UnSelWL(N-2), and the ground voltage GND for other word lines. According to an embodiment of the present disclosure, in the Vrf Rcv step, the nonvolatile memory device may execute the positive recovery for the $(N-1)^{th}$ unselected word line UnSelWL(N-1) and the $(N-2)^{th}$ unselected word line UnSelWL(N-2) with the first and second recovery voltages Vrcv1 and Vrcv2 that are higher than the ground voltage GND. After the negative boosting has been completed, since the difference of the read voltage Vread from each of the first and second recovery voltages Vrcv1 and Vrcv2 may be less than that from the ground voltage GND, the voltage level for a memory cell connected to the selected word line SelWL may be higher than that of a memory cell connected to the $(N-1)^{th}$ unselected word line UnSelWL(N-1), and the voltage level for a memory cell connected to the $(N-2)^{th}$ unselected word line UnSelWL(N-2) may be higher than that of a memory cell connected to an $(N-3)^{th}$ unselect word line UnSelWL(N-3).

According to an embodiment of the present disclosure, the first recovery voltage Vrcv1 may be higher than the second recovery voltage Vrcv2. When the first recovery voltage Vrcv1 is higher than the second recovery voltage Vrcv2, a degree of the negative boosting of the $(N-1)^{th}$ unselected word line UnSelWL(N-1) to which the first recovery voltage Vrcv1 is applied may be reduced. As a result, after the negative boosting has been completed, the voltage level for the memory cell connected to the $(N-1)^{th}$ unselected word line UnSelWL(N-1) may be higher than that of the memory cell connected to the $(N-2)^{th}$ unselected word line UnSelWL(N-2). Accordingly, the voltage potential difference between word lines WL may be reduced. Detailed descriptions of this issue will be provided later in FIG. 13B.

According to an embodiment in FIG. 13A, respective recovery operations are executed for two lines, that is, the $(N-1)^{th}$ unselected word line UnSelWL(N-1) and the $(N-2)^{th}$ unselected word line UnSelWL(N-2). However, the embodiment is not limited thereto. It will be understood by one of ordinary skill in the art that to the content described above may be similarly applied for executing the recovery operations for three lower word lines or more.

Figure 13B:
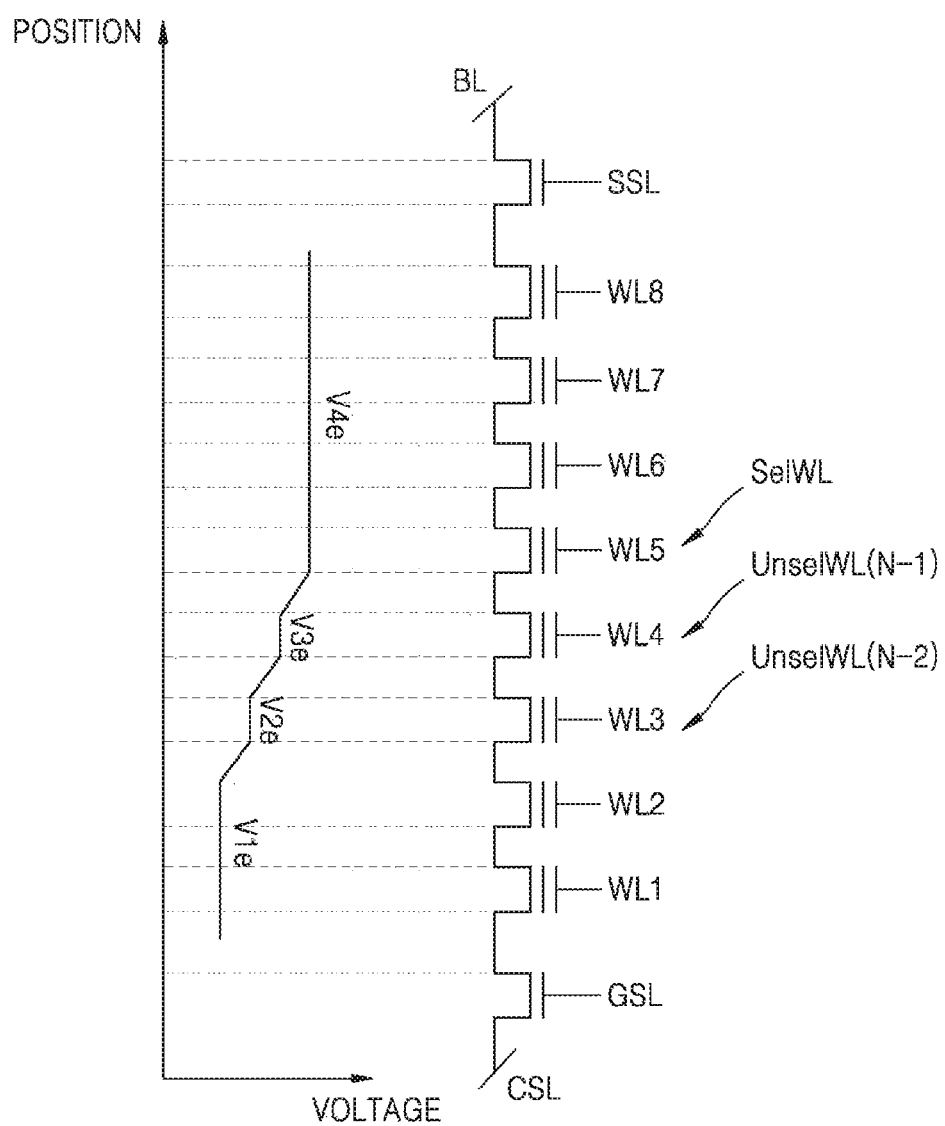
FIG. 13B is a graph of voltage potential of a cell string, according to an embodiment of the present disclosure.

FIG. 13B is a graph of voltage potential of a cell string, according to an embodiment of the present disclosure. FIG. 13B may be a graph of the voltage potential of a cell string at the time t2 in FIG. 13A. Descriptions of content overlapping with that in FIG. 12B will be omitted.

Referring to FIGS. 13A and 13C, the first and second word lines WL1 and WL2 may have a first voltage V1e, the third word line WL3 may have a second voltage level V2e, the fourth word line WL4 may have a third voltage level V3e, and the fifth through eighth word lines WL5 through WL8 may have a fourth voltage level V4e. The first voltage level V1e may be lower than the second voltage level V2e, the second voltage level V2e may be lower than the third voltage level V3e, and the third voltage level V3e may be lower than the fourth voltage level V4e.

FIG. 13B illustrates a case in which the selected word line SelWL is the fifth word line WL5, the positive recovery is executed for the fourth word line WL4 with the first recovery voltage Vrcv1, and the positive recovery is executed for the third word line WL3 with the second recovery voltage Vrcv2. In addition, the first recovery voltage Vrcv1 may have a higher voltage level than the second recovery voltage Vrcv2.

The degrees of the negative boosting of the fourth word line WL4 and the third word line WL3 may be different from each other due to the recovery voltage difference. As a result, after the negative boosting has been completed, the voltage level for the memory cell connected to the fourth word line WL4 may be higher than that of the memory cell connected to the third word line WL3. Accordingly, two horizontal sections in the voltage level between memory cells may be further generated, and thus, the voltage level difference between adjacent memory cells may be reduced. In other words, according to an embodiment of the present disclosure, since the voltage level difference between adjacent memory cells, which is the cause of the HCI phenomenon, may be reduced, the HCI phenomenon may be prevented and the program disturb may be reduced.

Figure 14:
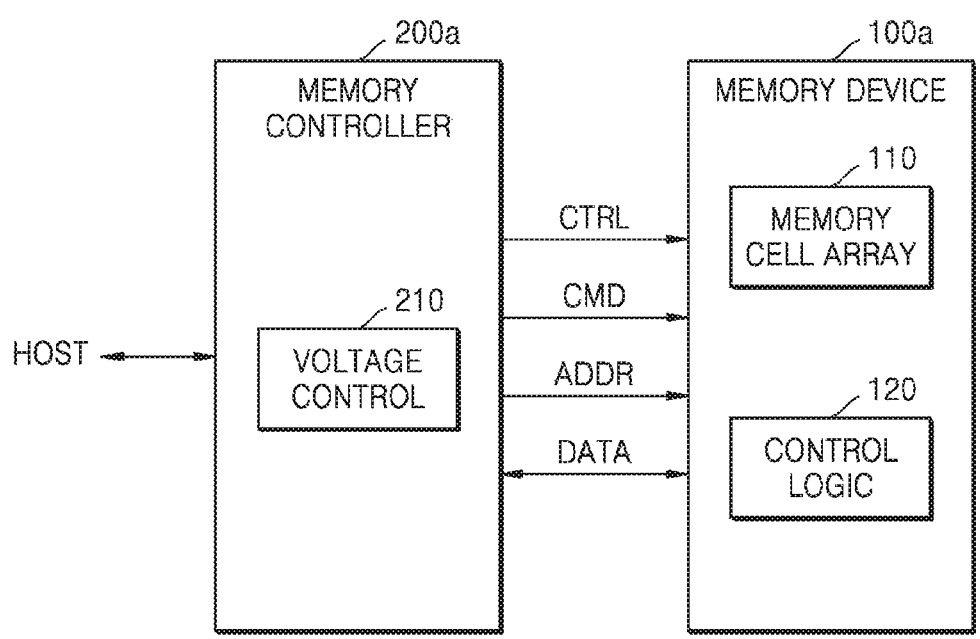
FIG. 14 is a block diagram of a nonvolatile memory system according to an embodiment of the present disclosure.

FIG. 14 is a block diagram of a nonvolatile memory system 20 according to an embodiment of the present disclosure.

Referring to FIG. 14, the nonvolatile memory system 20 may include a nonvolatile memory device 100a and a memory controller 200a, and the nonvolatile memory device 100a may include the memory cell array 110 and the control logic 120. According to an embodiment, the nonvolatile memory device 100a may be realized in a manner substantially similar to that of the nonvolatile memory device 100 in FIG. 1. Thus, content described above with reference to FIGS. 1 through 13B may be applicable to this embodiment and duplicate descriptions thereof will be omitted.

The memory controller 200a may include a voltage controller 210. The voltage controller 210 may generate voltage control signals for generating bias voltages applied to the memory cell array 110, for example, the word line voltage for driving the word lines WL, the string selection line voltage for driving the string selection lines SSL, and the ground selection line voltage for driving the ground selection lines GSL.

According to an embodiment of the present disclosure, during the program operation for the memory cell array 110, the voltage controller 210 may generate various voltage control signals so that, in the recovery operation executed at the time of moving from the Verify step to the program step, the recovery voltage higher than about 0 V is applied to at least one of the word lines, and the ground voltage GND is applied to other word lines. According to another embodiment of the present disclosure, the voltage controller 210 may generate various voltage control signals so that the first recovery voltage higher than about 0 V is applied the first word line, the second recovery voltage higher than the first recovery voltage is applied to the second word line, and the ground voltage GND is applied to other word lines. The memory controller 200a may transmit the voltage control signals to the nonvolatile memory device 100a via the command CMD, the address ADDR, the data DATA, or the control signal CTRL.

Figure 15:
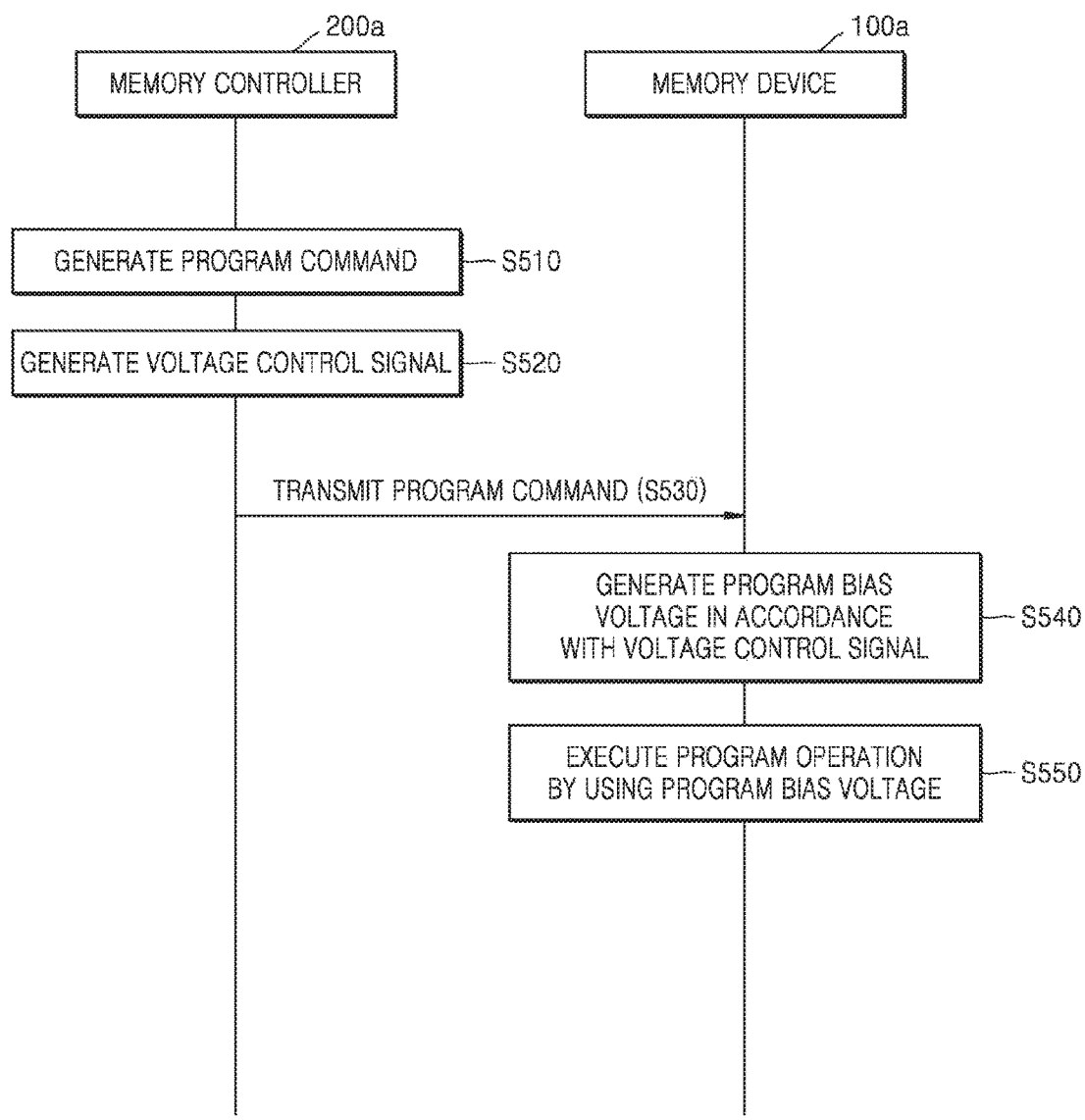
FIG. 15 is a flowchart of operations of a memory controller and a nonvolatile memory device, according to an embodiment of the present disclosure.

FIG. 15 is a flowchart of operations of a memory controller 200a and a nonvolatile memory device 100a, according to an embodiment of the present disclosure.

Referring to FIG. 15, the memory controller 200a may generate a program command CMD (S510). The memory controller 200a may generate the voltage control signal (S520). The memory controller 200a may generate various voltage control signals so that, in the recovery operation executed at the time of moving from the Verify step to the program step, the recovery voltage higher than about 0 V is applied to at least one of the word lines and the ground voltage GND is applied to other word lines.

The memory controller 200a may transmit the command CMD, the address ADDR, the data DATA, or the control signal CTRL to the nonvolatile memory device 100a (S530). Generated voltage control signals may be transmitted to the nonvolatile memory device 100a via the command CMD, the address ADDR, the data DATA, or the control signal CTRL.

The nonvolatile memory device 100a may generate a program bias voltage in accordance with a received control signal (S540). The program bias voltage may be at least one of the word line voltage, the recovery voltage, the string selection line voltage, and the ground selection line voltage. In this case, the nonvolatile memory device 100a may adjust timings and target lines of the recovery voltage to be applied, in accordance with the control voltage. The nonvolatile memory device 100a may execute the program operation for the memory cell array 110 by using the generated program bias voltage (S550).

Figure 16:
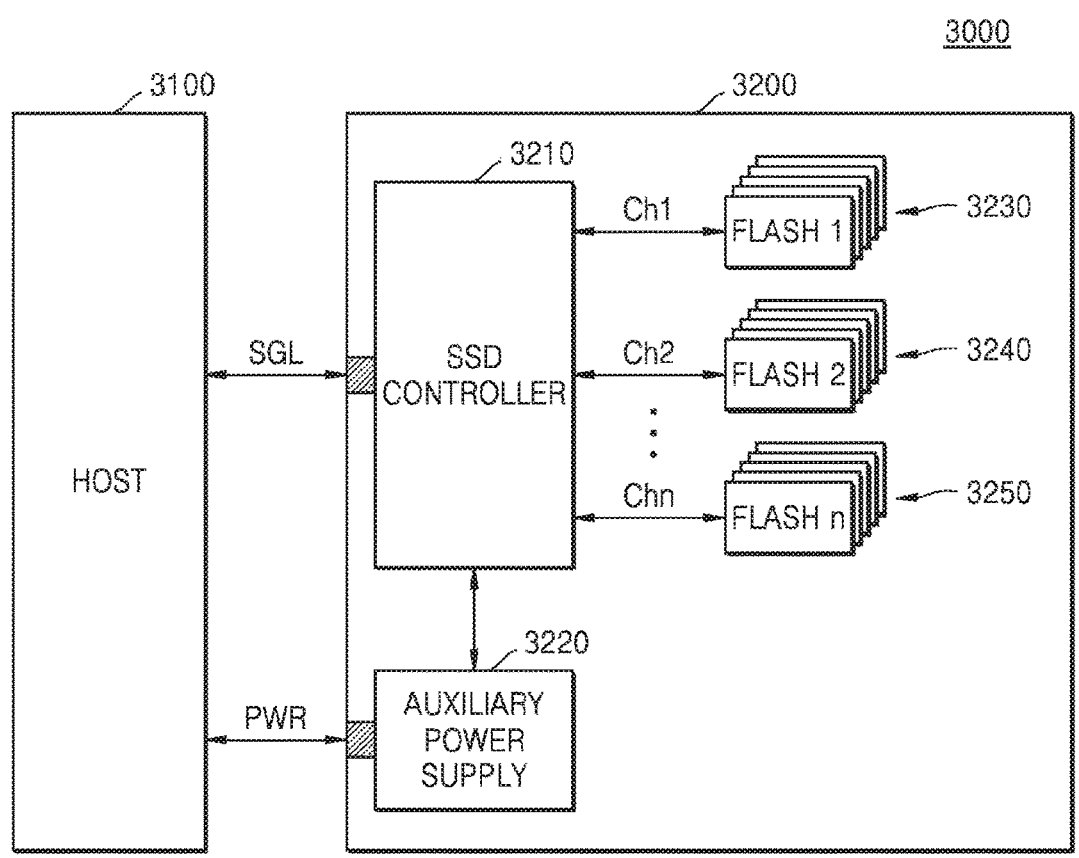
FIG. 16 is a block diagram of an example in which a nonvolatile memory device is applied to a solid state drive (SSD) system, according to an embodiment of the present disclosure.

FIG. 16 is a block diagram of an example in which a nonvolatile memory device is applied to a solid state drive (SSD) system 3000, according to an embodiment of the present disclosure.

Referring to FIG. 16, the SSD system 3000 may include a host HOST 3100 and a SSD 3200. The SSD 3200 may exchange signals SGL with the host HOST 3100 via a signal connector and receive power PWR via a power connector. The SSD 3200 may include an SSD controller 3210, an auxiliary power supply 3220, and flash memory devices 3230, 3240, and 3250. In this case, the SSD 3200 may be realized by using embodiments illustrated in FIGS. 1 through 15.

The nonvolatile memory device 100 of FIG. 2 may be applied to at least one of the flash memory devices 3230, 3240, and 3250. Accordingly, at the recovery operation during the program operation, at least one of the flash memory devices 3230, 3240, and 3250 may apply the recovery voltage higher than about 0 V for at least one word line and the ground voltage GND for other word lines. Accordingly, the voltage potential difference between the upper word line and the lower word line may be reduced and the HCI phenomenon may be prevented. As a result, the program disturb may be prevented and reliability of the SSD 3200 may be improved.

A nonvolatile memory device according to an embodiment of the present disclosure, may be applied not only to the SSD 3200 but also to a memory card system, a computing system, a universal flash storage (UFS), etc. In addition, the operation method of the nonvolatile memory device according to an embodiment of the present disclosure may be applied to various electronic systems including nonvolatile memories.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the present disclosure has been particularly shown and described with reference to embodiments thereof, it will be understood that various changes in form and details may be made therein without departing from the spirit and scope of the following claims.

What is claimed is:

1. A nonvolatile memory device comprising:
a memory cell array including a substrate and a plurality of memory cells connected to a plurality of word lines; and
a control logic that, in a transition process from a verification step to a bit line setup step for program operation of the plurality of memory cells, simultaneously applies a recovery voltage to at least one word line among the plurality of word lines, the recovery voltage being different from another recovery voltage applied to other word lines among the plurality of word lines, wherein:
the plurality of the word lines comprises a first word line group and a second word line group, and
the control logic applies a first recovery voltage to the first word line group, a second recovery voltage to the second word line group, and a third recovery voltage to other word lines, among the plurality of word lines, excluding the first and second word line groups.

2. The nonvolatile memory device of claim 1, wherein:
the plurality of the word lines comprises a first word line group, and
the control logic simultaneously applies a first recovery voltage to the first word line group and applies a second recovery voltage having a lower voltage level than the first recovery voltage to other word lines, among the plurality of word lines, excluding the first word line group.

3. The nonvolatile memory device of claim 2, wherein the first recovery voltage has a voltage higher than about 0 V, and the second recovery voltage is a ground voltage.

4. The nonvolatile memory device of claim 2, wherein the first word line group comprises a selected word line which is a program target.

5. The nonvolatile memory device of claim 2, wherein the first word line group comprises N (N is an integer equal to one or more) word lines disposed between a selected word line, which is a program target, and the substrate.

6. The nonvolatile memory device of claim 1, wherein:
a voltage level of the first recovery voltage is higher than that of the second recovery voltage, and
a voltage level of the second recovery voltage is higher than that of the third recovery voltage.

7. The nonvolatile memory device of claim 1, wherein:
the first word line group comprises a selected word line which is a program target, and
the second word line group comprises a word line disposed between the selected word line and the substrate.

8. The nonvolatile memory device of claim 1, wherein the control logic maintains a voltage level of the recovery voltage in the bit line setup step.

9. The nonvolatile memory device of claim 1, wherein after the bit line setup step has been completed, the control logic applies a program voltage to a selected word line, among the plurality of word lines, that is a program target and a pass voltage to an unselected word line, which is not the program target.

10. A program method of a nonvolatile memory device programming memory cells connected to a plurality of word lines, the program method comprising:
applying, in a verification operation, a plurality of verification voltages to the plurality of word lines;
executing, in a transition process from the verification operation to a bit line setup operation, a recovery step by simultaneously applying a first recovery voltage to at least one word line among the plurality of word lines and a secondary recovery voltage having a lower voltage level than the first recovery voltage to word lines, among the plurality of word lines, other than the at least one word line; and
applying: (1) a program voltage to a selected word line, among the plurality of word lines, the selected word line being a program target, and (2) a pass voltage to an unselected word line which is not the program target, wherein:
the at least one word line comprises an (N−1)th word line disposed between the selected word line and a substrate of the nonvolatile memory device, and
after the recovery step has been completed, a gate voltage level of a memory cell connected to the (N−1)th word line is higher than a gate voltage level of a memory cell connected to an (N−2)th word line disposed between the (N−1)th word line and the substrate.

11. The method of claim 10, wherein the at least one word line comprises at least one of the selected word line and an (N−1)th word line which is disposed between the selected word line and a substrate of the nonvolatile memory device.

12. The method of claim 10, wherein the first recovery voltage has a voltage level higher than about 0 V, and the second recovery voltage is a ground voltage.

13. The method of claim 10, wherein:
the at least one word line comprises the selected word line,
after the recovery step has been completed, a gate voltage level of a memory cell connected to the selected word line is lower than a gate voltage level of a memory cell connected to an (N+1)th word line, and
the selected word line is disposed between the (N+1)th word line and a substrate of the nonvolatile memory device.

14. A memory device comprising:
a string of memory cells, each of the memory cells addressed by a bit line and a different word line among a plurality of word lines; and
a control logic that, while transitioning from a program-verification operation of an Nth-programming operation to a bit-line setup operation for an (N+1)th programming operation of a target memory cell of the memory cells, simultaneously applies a first recovery voltage to a selected word line among the plurality of word lines and a second recovery voltage, which is different from the first recovery voltage, to other word lines among the plurality of word lines that are not the selected word line, wherein:
the control logic, while transitioning from the program-verification operation of the Nth-programming operation to the bit-line setup operation for the (N+1)th programming operation of the target memory cell, applies a third recovery voltage to word lines, among the plurality of word lines, other than the selected word line and the other word line, and
the second recovery voltage is greater than the third recovery voltage.

15. The memory device of claim 14, wherein the first recovery voltage is greater than the second recovery voltage.

16. The memory device of claim 14, wherein the selected word line addresses the target memory cell.

17. The memory device of claim 14, wherein the selected word line addresses a memory cell, among the memory cells, that was programmed immediately before the target memory cell.

* * * * *